US009389492B2

(12) United States Patent
Adema et al.

(10) Patent No.: US 9,389,492 B2
(45) Date of Patent: Jul. 12, 2016

(54) ROTATIONALLY STATIC LIGHT EMITTING MATERIAL WITH ROTATING OPTICS

(71) Applicant: CHRISTIE DIGITAL SYSTEMS USA., Cypress, CA (US)

(72) Inventors: Daniel Robert Adema, Kitchener (CA); Graham Hill, Waterloo (CA); Joseph Ma, Waterloo (CA)

(73) Assignee: CHRISTIE DIGITAL SYSTEMS USA, INC., Cypress, CA (US)

( * ) Notice: Subject to any disclaimer, the term of this patent is extended or adjusted under 35 U.S.C. 154(b) by 226 days.

(21) Appl. No.: 14/444,283

(22) Filed: Jul. 28, 2014

(65) Prior Publication Data

US 2016/0025307 A1    Jan. 28, 2016

(51) Int. Cl.
*G03B 21/20* (2006.01)
*G03B 21/00* (2006.01)
*H01S 5/00* (2006.01)
*H04N 9/00* (2006.01)

(52) U.S. Cl.
CPC ............... *G03B 21/00* (2013.01); *G03B 21/204* (2013.01); *H01S 5/00* (2013.01); *H04N 9/00* (2013.01)

(58) Field of Classification Search
CPC ....... F21V 17/02; F21V 29/503; F21V 29/56; F21V 29/70; F21V 5/04; F21V 9/00; G03B 15/05; G03B 21/00; G03B 21/204; H01S 5/00; H04N 9/00
See application file for complete search history.

(56) References Cited

U.S. PATENT DOCUMENTS

| 8,485,669 B2 | 7/2013 | Katou et al. |
| 2006/0221022 A1 | 10/2006 | Hajjar |
| 2007/0206258 A1 | 9/2007 | Malyak et al. |
| 2008/0291140 A1 | 11/2008 | Kent |
| 2011/0044046 A1 | 2/2011 | Abu-Ageel |
| 2013/0308295 A1 | 11/2013 | Bartlett |

FOREIGN PATENT DOCUMENTS

| JP | 2010197497 A | 9/2010 |
| JP | 2010197497 A * | 9/2010 |

OTHER PUBLICATIONS

Extended European Search Report dated Jan. 5, 2016 for European Patent Application No. 1517849981553.

* cited by examiner

*Primary Examiner* — Sultan Chowdhury
*Assistant Examiner* — Danell L Owens
(74) *Attorney, Agent, or Firm* — Perry + Currier, Inc.

(57) ABSTRACT

A system including rotationally static light emitting material with rotating optics is provided. The system comprises: a heatsink; at least one light emitting material on the heatsink, at least a portion of the light emitting material being circularly symmetrical around an axis, the heatsink and the light emitting material being rotationally fixed; optics configured to rotate relative to the at light emitting material around a rotational axis that is coaxial with the axis of the light emitting material, the optics configured to: receive excitation light along the rotational axis; convey the excitation light to one or more locations on the light emitting material as the optics are rotating; collect light emitted from the one or more locations on the light emitting material excited by the excitation light; and, convey the light collected from the at least one light emitting material to the rotational axis for emission there along.

19 Claims, 17 Drawing Sheets

ROTATIONALLY STATIC LIGHT EMITTING MATERIAL WITH ROTATING OPTICS

FIELD

The specification relates generally to light generation systems, and specifically to a rotationally static light emitting material with rotating optics.

BACKGROUND

In laser-light emitting materials illumination systems, a limiting factor to the product performance is the cooling of the light emitting material, for example a phosphor. One of the benefits of putting the phosphor on a rotating wheel is that it distributes the incident energy over a larger area, effectively decreasing the heat density. When a rotating liquid-cooled phosphor wheel is used in high power applications, however, it is necessary to contain a cooling liquid using a rotating seal. Rotating seals have a finite lifespan, which may be less than what is desired for the illumination source or for the projector application. Furthermore, high energy density in a spot of a light emitting material can result in degradation in performance of the material.

SUMMARY

In general, this disclosure is directed to a rotationally static light emitting material with rotating optics. An input path (and alternatively an output path) of excitation light (including, but not limited to laser light) and an output path of light are fixed along a rotational axis of optics that rotate about a rotationally fixed light emitting material and heatsink, to distribute light production at the light emitting material over the surface of the heatsink, so that a static heat sink can be used to cool the light emitting material, for example a water block, heat pipes, vapour chambers, heat spreaders and the like. At least a portion of the rotationally static light emitting material has circular symmetry, and the rotating optics are coaxial with the rotationally static light emitting material; the rotating optics are rotated using a motor, and the like about the light emitting material. Excitation light is received at the optics along the rotational axis, and the optics convey the excitation light to the rotationally static light emitting material as the optics are rotating, sweeping out a circle of the excitation light on the rotationally static light emitting material. The excitation light excites the light emitting material, which in turn emits light; the light is collected by the rotating optics which conveys the light produced by the light emitting material back to the rotational axis, where the light exits the optics, for example towards collection optics and/or projector optics so that images can be produced from the emitted light, e.g. in a projector system. As the excitation light is collected along the rotational axis, and the emitted light exits the optics along the rotational axis, the positions of the laser and the collector optics are fixed. Further, as the light emitting material is rotationally static, the light emitting material is located on a rotationally static heatsink; hence the heatsink can be cooled using a rotationally static heatsink, including waterblocks, obviating the use of a rotating seal. As the optics cause the excitation light to illuminate the light emitting material by sweeping out a circle, and the like, heat generation at the light emitting material is also spread out over the circle, preventing heat build up at one spot on the light emitting material without rotation of the light emitting material. The heatsink/light emitting material can be linearly translated parallel and/or perpendicularly to the optics so that the excitation light sweeps out a spiral type shape on the light emitting material in order to further spread out heat generation on the light emitting material.

In this specification, elements may be described as "configured to" perform one or more functions or "configured for" such functions. In general, an element that is configured to perform or configured for performing a function is configured to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XYY, YZ, ZZ, and the like). Similar logic can be applied for two or more items in any occurrence of "at least one . . . " and "one or more . . . " language.

An aspect of the specification provides a system comprising: a heatsink; at least one light emitting material located on the heatsink, at least a portion of the at least one light emitting material being circularly symmetrical around an axis, the heatsink and the at least one light emitting material being rotationally fixed; optics configured to rotate relative to the at least one light emitting material around a rotational axis that is coaxial with the axis of the at least one light emitting material, the optics configured to: receive excitation light along the rotational axis; convey the excitation light to one or more locations on the light emitting material as the optics are rotating; collect light emitted from the one or more locations on the light emitting material excited by the excitation light; and, convey the light collected from the at least one light emitting material to the rotational axis for emission there along.

The system can further comprise a motor configured to rotate the optics relative to the at least one light emitting material.

The system can further comprise at least one stationary light source configured to generate the excitation light.

The system can further comprise: at least one stationary light source configured to generate the excitation light; and stationary optics for conveying the excitation light to the optics along the rotational axis.

The system can further comprise one or more of a body and a frame, one or more of the body and the frame comprising the optics.

The system can further comprise one or more of a body and a frame, one or more of the body and the frame comprising the optics and a counter balance so that a center of mass of one or more of the body and the frame is located along the rotational axis.

The optics can comprise one or more of: at least one dichroic mirror; at least one lens; and at least one prism.

A surface of the heatsink and the at least one light emitting material can comprise an annulus symmetrical about the axis, and the optics are further configured to rotate along the surface.

The heatsink can comprise a cylinder, and the at least one light emitting material can be located on an interior surface of the cylinder, the optics configured to rotate within the cylinder.

The heatsink can comprise a cylinder, and the at least one light emitting material can be located on an exterior surface of the cylinder, the optics further configured to rotate around the exterior surface of the cylinder.

The at least one light emitting material can comprise at least two light emitting materials located at different portions of the heatsink, each of the at least two light emitting materials being circularly symmetric about the axis, the optics further configured to convey the excitation light to each of the at least two light emitting materials as the optics are rotating.

The optics can be further configured to: convey the excitation light to at least two different portions of the at least one light emitting material; collect the light emitted from the at least two different portions excited by the excitation light; and convey the light collected from the at least two different portions to the rotational axis for emission there along.

The system can further comprise apparatus for displacing the heatsink relative to the optics.

The heatsink can further comprise a static waterblock.

The heatsink can comprise a toroid symmetrical about the axis.

The heatsink can comprise a toroid symmetrical about the axis and the optics are configured to one or more of: receive the excitation light through the toroid; and convey the light collected from the at least one light emitting material through the toroid.

The optics can be further configured to receive the excitation light from a first side of the optics and convey the light collected from the at least one light emitting material back through the first side.

The optics can be further configured to receive the excitation light from a first side of the optics and convey the light collected from the at least one light emitting material through a second side opposite the first side.

The light emitting material can be located on opposing sides of the heatsink and the optics can be further configured to receive the excitation light from both of the opposing sides of the heatsink.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
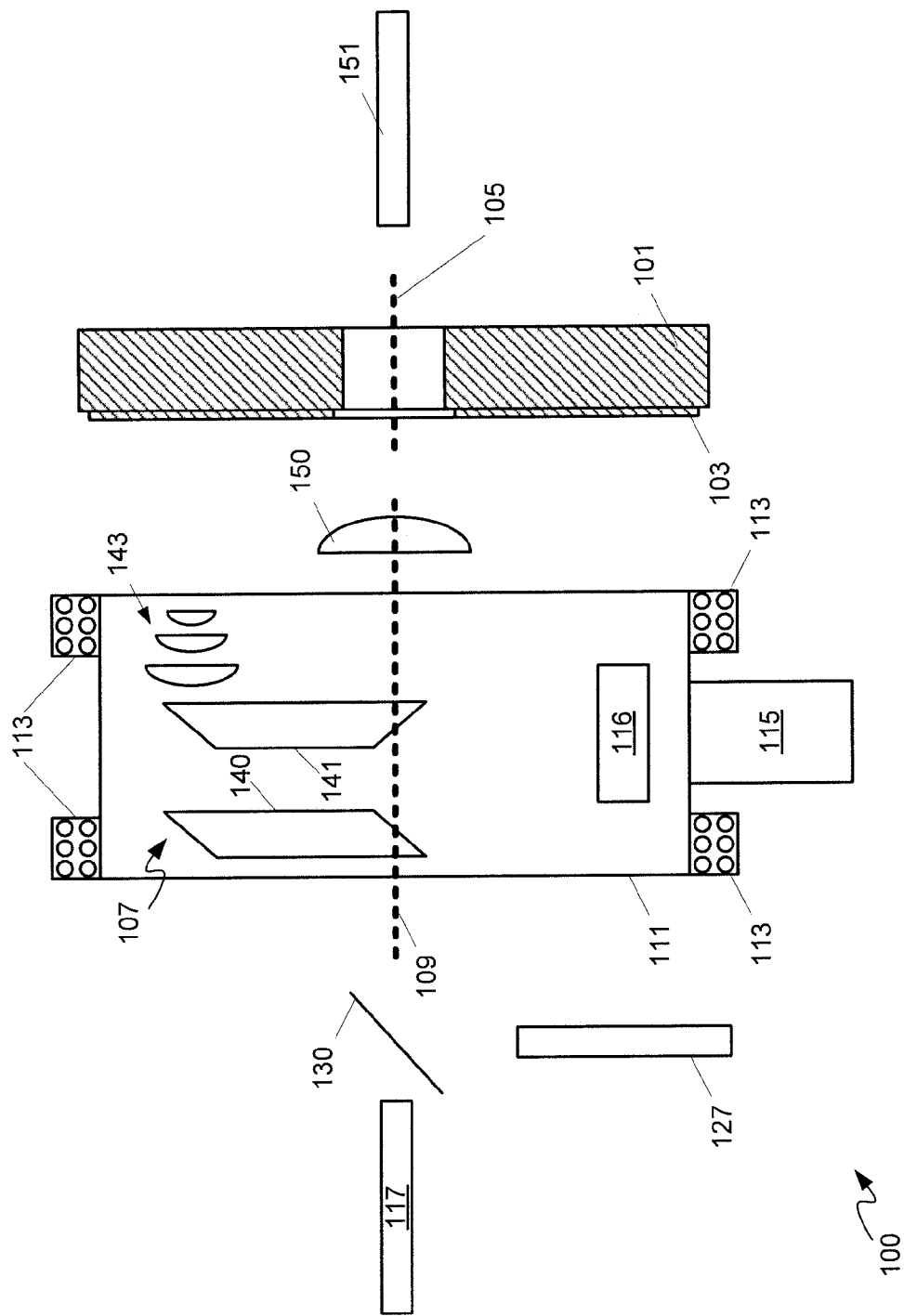
FIG. 1 depicts a side view, and a partial cross-sectional view, of a system that includes a rotationally static light emitting material with rotating optics, according to non-limiting implementations.

FIG. 1 depicts a side view, and partial cross-sectional view, of a system 100 comprising a heatsink 101; at least one light emitting material 103 located on heatsink 101, at least a portion of at least one light emitting material 103 being circularly symmetrical around an axis 105, heatsink 101 and at least one light emitting material 103 being rotationally fixed; and, optics 107 configured to rotate relative to at least one light emitting material 103 around a rotational axis 109 that is coaxial with axis 105 of at least one light emitting material 103. As described below, optics 107 are configured to: receive excitation light along rotational axis 109; convey the excitation light to one or more locations on at least one light emitting material 103 as optics 107 are rotating; collect light emitted from the at one or more locations on the at least one light emitting material 103 excited by the excitation light; and, convey the light collected from at least one light emitting material 103 to rotational axis 109 for emission there along. It is appreciated that, in FIG. 1, heatsink 101 and light emitting material 103 are depicted in cross-section, and comprise a toroid and/or annulus, the cross-section being along a diameter of the toroid and/or annulus; furthermore, optics 107 are depicted schematically. At least one light emitting material 103 will be interchangeably referred to hereafter as light emitting material 103.

Indeed, as depicted system 100 further comprises one or more of a body and a frame (the body and/or frame hereinafter referred to as frame 111) that comprises optics 107. Frame 111 rotates on one or more bearings 113 located along an outer edge of frame 111; alternatively, bearings 113 can be located at a hub (not depicted) of frame 111. System 100 further comprises a motor 115 configured to rotate frame 111, and hence optics 107, relative to light emitting material 103. For example, motor 115 can interact with frame 111 to rotate frame 111, on bearings 113, about rotational axis 109. Motor 115 can rotate frame 111 using a belt (not depicted) and/or other device for translating rotational motion to frame 111. Alternatively motor 115 can comprise a ring motor and/or any other type of motor configured to rotate frame 111. Indeed, any device for rotating frame 111 around rotational axis 109 is within the scope of present implementations.

In some implementations, system 100 and/or frame 111 is rotationally symmetric such that a center-of-mass of frame 111 is located along rotational axis 109. In other implementations, as depicted, frame 111 further comprises an optional counter-balance 116 located so that a centre-of-mass of frame 111 is located along rotational axis 109. For example, as optics 107 are generally asymmetric with respect to frame 111 (i.e. optics 107 are located off-centre from rotational axis 109), when frame 111 and optics 107 are rotated, vibration can occur due to the centre-of-mass of optics 107 being off of rotational axis 109; counter-balance 116 can hence be located on an opposite side of frame 111 to optics 107 to counter-balance optics 107 during rotation and reduce the possibility of vibration of frame 111 and optics 107.

As depicted system 100 further comprises at least one stationary laser source 117 configured to generate the excitation light, interchangeably referred to hereafter as laser 117. However, laser 117 can alternatively be replaced with any light source that will generate excitation light, and the light source need not be a laser. Hence, while excitation light in system 100 can comprise laser light, any excitation light that will excite light emitting material 103 to emit light is within the scope of present implementations. For example, excitation light is generally light that is of a shorter wavelength than light emitted by light emitting material 103. Indeed, light emitting material 103 can interchangeably be referred to as a light conversion material as light emitting material 103 converts excitation light having a first wavelength into emitted light having a second wavelength longer than the first wavelength.

As depicted, laser 117 (and/or an excitation light source) is located along rotational axis 109, however in other implementations laser 117 can be located off rotational axis 109. For example, as depicted, system 100 further comprises an optional second laser 127 (and/or second excitation light source) and optional stationary optics 130 for conveying excitation light from laser 127 to optics 107 along rotational axis 109. As depicted stationary optics 130 comprises a dichroic mirror located along a rotational axis 109, and along a path of excitation light emitted from laser 117, and along a path of excitation light emitted from laser 127; the dichroic mirror is configured to combine excitation light from lasers 117, 127 so that the excitation light is conveyed to optics 107 along rotational axis 109. For example, excitation light from laser 117 passes through dichroic mirror to optics 107, while excitation light from laser 117 is reflected along rotational axis 109 into optics 107. Hence, whether a laser is on or off rotational axis 109, excitation light from a laser in system 100 is received at optics 107 along rotational axis 109.

Each of laser 117 and optional laser 127 can comprise a blue laser source of similar or different wavelengths. For example, in some implementations, laser 117 can comprise a laser source of about 448 nm and laser source 127 can comprise a laser source of about 465 nm. Furthermore, while light sources described herein are described with reference to lasers, in other implementations, system 100 can comprise light sources different from lasers.

In yet further implementations, system 100 can comprise one or more integrating rods (not depicted) located along an excitation light path of each of lasers 117, 127 for integrating excitation light there from.

Optics 107 comprises one or more of at least one dichroic mirror; at least one mirror; at least one lens; and at least one prism. As depicted optics 107 comprise a first prism 140, a second prism 141, and lenses 143. Each of prisms 140, 141 can comprise reflection surfaces, including but not limited to total internal reflection surfaces, at opposite ends for reflecting light and/or excitation light either through each respective prism 140, 141 and/or out of each prism. In some implementations, each of the reflection surfaces can include with a mirror and/or a dichroic mirror. Alternatively each reflection surface of each prism 140, 141 can include and/or be replaced by a mirror and/or a dichroic mirror so that angles of the surfaces to the body do not have to be controlled to be total internal reflection angles.

Lenses 143 comprise one or more lenses configured to focus excitation light on light emitting material 103, and collect light emitted by light emitting material 103, and convey the light emitted by phosphor back through prism 141, as described in more detail below. While three lenses 143 are depicted, lenses 143 can comprise fewer than three lenses or more than three lenses.

As depicted, system 100 further comprises collection optics, located along rotational axis 109 (and/or axis 105), which can include, but is not limited to one or more lenses 150 and an integrator 151. The collection optics can be rotational and/or stationary; for example lens 150 can rotate with optics 107, and integrator 151 can be stationary or also rotate with optics 107. Collection optics can convey light emitted from optics 107 along rotational axis 109 and/or axis 105 to, for example, a light modulator (not depicted) and the like. Indeed, one or more of collection optics can be elements of projection optics for a projector. Collection optics can comprise one or more lenses, one or more integrating rods, optical fibers, and/or any other optical elements for collecting light emitted from optics 107 along rotational axis 109 and/or conveying light emitted from optics 107 along rotational axis 109 to a projector and the like. As depicted, lens 150 collects light emitted from optics 107 (i.e. light emitted by light emitting material 103 which has been collected by lenses 143 and conveyed to rotational axis 109 by prism 141), and conveys the light to an input of integrator 151, which in turn conveys the light to a light modulator, and the like. As depicted, the light is conveyed through an aperture of toroidal heatsink 101, located at a geometric centre of heatsink 101; however, in other implementations, the light can be conveyed along a same path as excitation light input to optics 107 and reflected towards collection optics using a dichroic mirror and the like.

It is further appreciated that relative sizes and thicknesses of elements in FIG. 1 are not to scale. For example, a thickness of light emitting material 103 relative to dimensions of heatsink 101 is not depicted to scale; further, a gap between lenses 143 and light emitting material 103 is not depicted to scale.

Light emitting material 103 can include, but is not limited to, one or more of a phosphor, a ceramic phosphor, quantum dots, a luminescent material, a fluorescent material, and the like; indeed, while present implementations will be described with regard to ceramic phosphors, other light emitting materials are within the scope of present implementations. Specifically, light emitting material 103 comprises any material that emits light when excited by excitation light, and the like.

Figure 6:
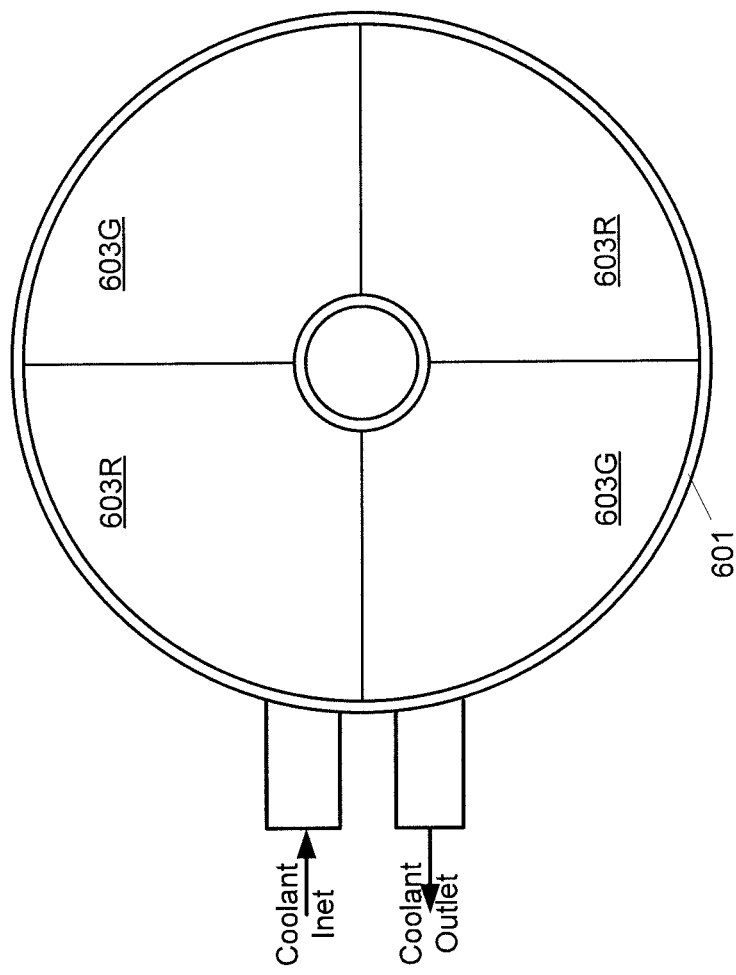
FIG. 6 depicts a front perspective view of an alternative heatsink and light emitting materials, according to non-limiting implementations.

For example, in some implementations, light emitting material 103 can be configured for excitation by blue excitation light (e.g. from laser 117 and/or laser 127), and emit light of a wavelength longer than the blue excitation light, including, but not limited to, red light and green light. Further, in some implementations, light emitting material 103 comprises more than one light emitting material located, for example, in segments on heatsink 101, as described below with respect to FIG. 6. For example, one or more segments of light emitting material 103 can emit red light, while one or more other segments of light emitting material 103 can emit green light; hence, when heatsink 101 and light emitting material 103 comprises a light emitting wheel, as depicted, as optics 107 rotate, the blue excitation light, and the like interacts with the different segments of light emitting material 103.

Furthermore, in some implementations, light emitting material 103 can be located on a reflective surface of heatsink 101 so that light emitted from light emitting material 103 towards heatsink 101 is reflected away from heatsink 101 towards optics 107, as described below.

System 100 can generally be used in a projection system (not depicted), in which, for example, blue excitation light excites light emitting material 103, which emits red light and/or green light and/or yellow light, the blue excitation light, the emitted light providing RGB (red-green-blue) light and/or white light to the projection system. Alternatively, light emitting material 103 can emit blue light in the RGB/white system.

In general, the process of exciting light emitting material 103 to emit light results in the production of heat which is to be dissipated to prevent light emitting material 103 and heatsink 101 from heating up and/or to control a temperature of light emitting material 103. As light emitting material 103 emits light, heat flows into heatsink 101 from the interface between light emitting material 103 and heatsink 101, the heat being dissipated at heatsink 101. Hence, heatsink 101 comprises one or more of a heatsink, a block, a wheel, a ring, one or more extrusions or other heat sink design (e.g. for air cooling), a water-block, a vapour chamber, a heat spreader, and the like, configured to cool light emitting material 103. Heatsink 101 can comprise any material configured to cool light emitting material 103 including, but not limited to, metal, aluminum, steel and the like. Further, as depicted, heatsink 101 comprises a plate of material with nominally circular symmetry, though other shapes are within the scope of present implementations, including, but not limited to, a square, a rectangle and the like. Indeed shapes that do not have circular symmetry are within the scope of present implementations: for example, heatsink 101 can be rectangular, with adjacent segments of different light emitting material; however, at least of portion of light emitting material 103 has circular symmetry around axis 105.

Figure 2:
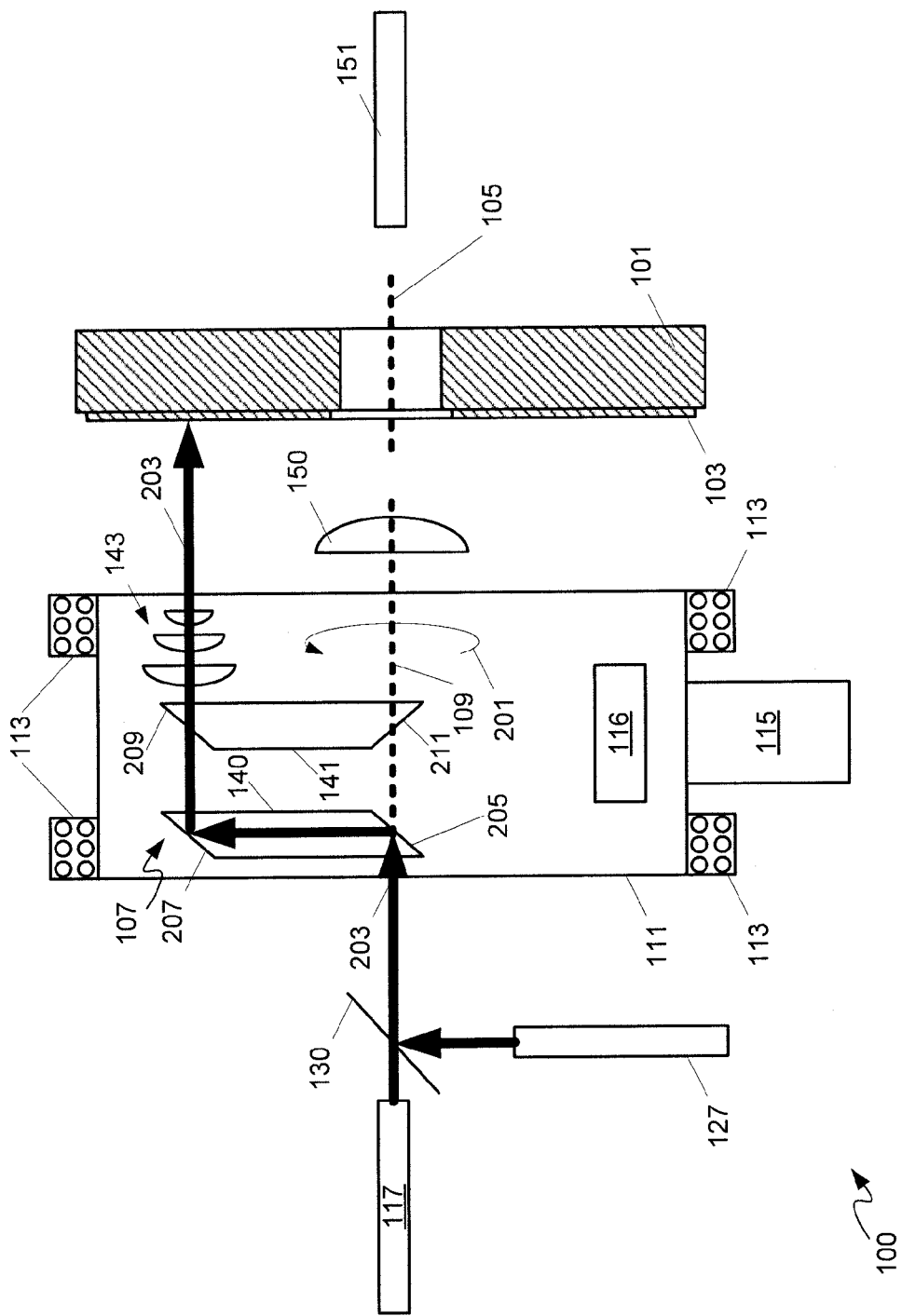
FIG. 2 depicts a path of excitation light through the system of FIG. 1, according to non-limiting implementations.
Figure 3:
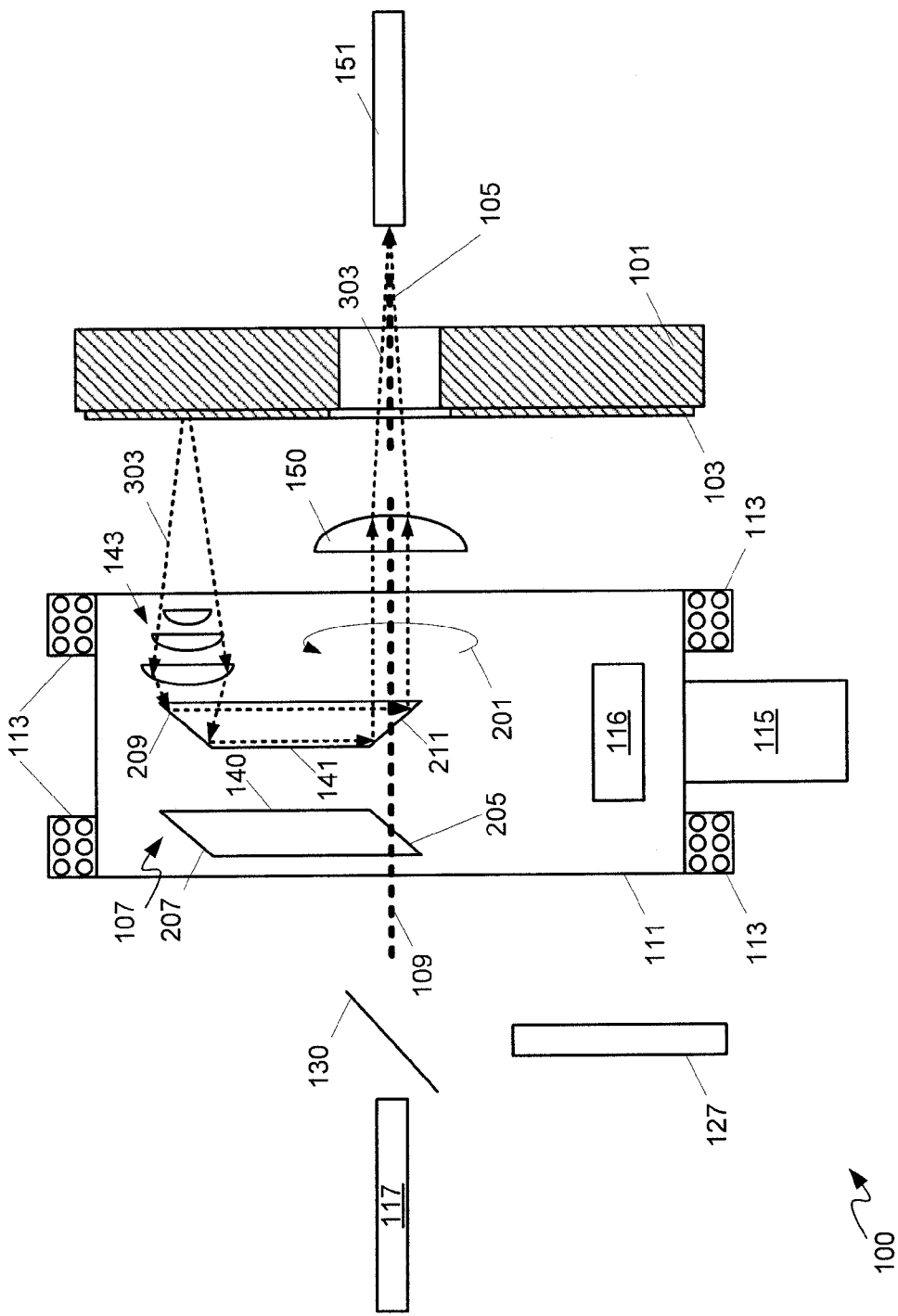
FIG. 3 depicts a path of light emitted from a light emitting material through the system of FIG. 1, according to non-limiting implementations.

Attention is next directed to FIGS. 2 and 3 which depict system 100 in operation; FIGS. 2 and 3 are substantially similar to FIG. 1 with like elements having like numbers. In FIG. 2 motor 115 interacts with frame 111 to rotate optics 107 about rotational axis 109, as indicated by arrow 201. For example, with respect to FIG. 2, optics 107 are rotated out of the page above rotational axis 109 and into the page below rotational axis 109, though the terms "out", "into", "above" and "below" are used for descriptive purposes only and system 100 can have any suitable orientation, for example within a projection system. Further, lasers 117, 127 are operated to emit excitation light 203: excitation light 203 from laser 117 passes through the dichroic mirror of stationary optics 130 along rotational axis 109 towards an entrance face of prism 140, and excitation light 203 from laser 127 is reflected by the dichroic mirror along rotational axis 109 towards the entrance face of prism 140. Frame 111 hence comprises an aperture and the like so that excitation light 203 enters prism 140.

An input and/or an entrance face and a first reflection surface 205 of prism 140 is located along rotational axis 109; first reflection surface 205 can comprise one or more of a total internal reflection surface, a mirror, a dichroic mirror and the like, and is configured to reflect excitation light 203 about perpendicular to rotational axis 109 along a body of prism 140, the body of prism 140 also being about perpendicular to rotational axis 109 (i.e. along a rotational radius of a path of optics 107). Surface 205 can hence be at about 45° to rotational axis 109. Excitation light 203 enters prism 140 along rotational axis 109 and is reflected through the body of prism 140 towards a second reflection surface 207, which is configured to reflect excitation light 203 towards light emitting material 103, for example through an end of prism 141 and through lenses 143. Surface 207 can hence also be at about 45° to rotational axis 109.

Excitation light 203 then impinges on light emitting material 103, as described below with respect to FIG. 3. As also depicted in FIG. 2, prism 141 comprises a first reflection surface 209 and a second reflection surface 211 separated by a body; first reflection surface 209 is located on a path of excitation light 203 as excitation light 203 is reflected from surface 207 towards light emitting material 103; hence surface 209 is configured to transmit excitation light 203 there through and comprise one or more of: a total internal reflection surface for light impinging on surface 209 in a direction opposite a path of excitation light 203; and a dichroic mirror.

Attention is next directed to FIG. 3 where light 303 emitted from light emitting material 103 upon excitation by excitation light 203 is collected by lenses 143. Though excitation light 203 is not depicted in FIG. 3 for clarity, excitation light 203 is nonetheless present (for example, see FIG. 4); indeed, excitation light 203 can excite light emitting material 103 in a generally constant manner, such that light 303 is also emitted constantly. In any event, lenses 143 collect light 303, which can be emitted as a cone, and the like (e.g. light 303 has an etendue), and lenses 143 direct light 303 towards reflection surface 209. Surface 209 reflects light 303 towards reflection surface 211, about perpendicular to rotational axis, through a body of prism 141. Surface 209 can hence be at about 45° to rotational axis 109. Prism 141 is hence also about perpendicular to rotational axis 109 (i.e. along a rotational radius of a path of optics 107).

Reflection surface 211 is located along rotational axis 109, and is configured to reflect light 303 out of prism 141, for example through an exit face (and/or an output of optics 107), along rotational axis 109 and towards lens 150, which in turn focuses light 303 onto an input of integrator 151 through an aperture of heatsink 101. Surface 211 can hence be at about 45° to rotational axis 109. As well, frame 111 is appreciated to comprise an aperture and the like between prism 141 and lens 150 so that light 303 can exit frame 111.

In some implementations, light 303 can be emitted over a plurality of angles, including, but not limited to a cone, or other shape, and the like, each of lenses 143, 150 and surfaces 209, 211 can be of a size and/or geometry and/or location to collect a substantial portion and/or all of light 303. For example, as depicted, edges of light 303 pass through lenses 143 which in turn convey light 303 towards surface 209; surface 209 is of a size and location to contain the edges of light 303, as is the body of prism 141; surface 211 is similarly of a size and location to contain edges of light 303, which can be collimated within the body of prism 141. Alternatively total internal reflection within the body of prism 141 can contain light 303 therein. Light 303 can be generally collimated when exiting prism 141, and an entrance surface of lens 150 can be larger than edges of light 303 as light 303 impinges on lens 150. Lens 150 generally focuses light 303 onto integrator 151, which integrates light 303 and conveys light 303 towards projection optics, and the like.

As excitation light 203 is being conveyed to light emitting material 103 through optics 107, and as optics 107 are collecting and conveying light 303 to collection optics, optics 107 are rotating relative to light emitting material 103. As an input (e.g. one or more of an entrance face of prism 140 and reflection surface 205) and an output (e.g. one or more of an exit face of prism 141 and reflection surface 211) of optics 107 are located on rotational axis 109, optics 107 conveys excitation light 203 to light emitting material 103, and conveys light 303 to collection optics, regardless of where optics 107 are located on a rotation path. In other words, each reflection surface 205, 211 are located on rotation axis 109 and rotate about rotation axis 109. Further, the input and an output of optics 107 can be about centred on rotational axis 109. Hence, regardless of where optics 107 are located on a rotation path, surface 205 collects excitation light 203 into optics 107 and surface 211 conveys light 303 out of optics 107.

Figure 4:
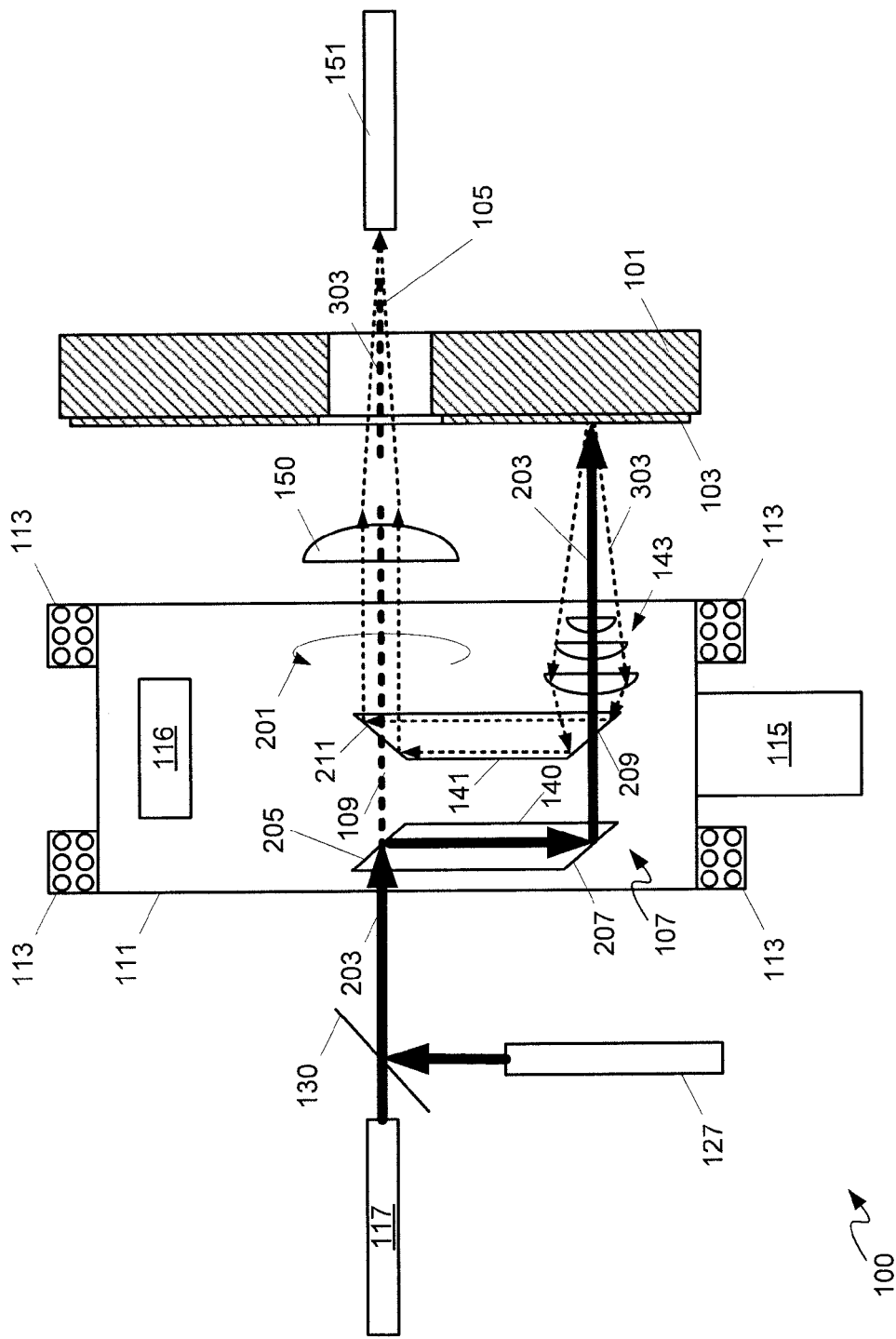
FIG. 4 depicts the system of FIG. 1 with rotating optics moved to a different position as compare to FIG. 1, according to non-limiting implementations.

For example, attention is next directed to FIG. 4 which depicts system 100 after optics 107 have been rotated through 180° relative to FIGS. 2 and 3; indeed, FIG. 4 is substantially similar to FIGS. 2 and 3 with like elements having like numbers. However, in FIG. 4, optics 107 have been rotated to a location on a rotation path, opposite and/or 180° from a location in FIGS. 2 and 3. Again, as an input (e.g. one or more of an entrance face of prism 140 and reflection surface 205) and an output (e.g. one or more of an exit face of prism 141 and reflection surface 211) of optics 107 are located on rotational axis 109, optics 107 conveys excitation light 203 to light emitting material 103, and conveys light 303 to collection optics, regardless of where optics 107 are located on a rotation path.

Hence, optics 107 are generally configured to: receive excitation light 203 along rotational axis 109, as in FIGS. 2 and 4, for example by locating surface 205 along rotational axis 109; convey excitation light 203 to at least one light emitting material 103 as the optics are rotating, for example via surfaces 205, 207; collect light 303 emitted from at least one light emitting material 103 excited by excitation light 203, as in FIGS. 3 and 4, for example using lenses 143; and, convey light 303 collected from at least one light emitting material 13 to rotational axis 109 for emission there along, as in FIGS. 3 and 3, for example using lenses 143, and surfaces 209, 211.

Figure 5:
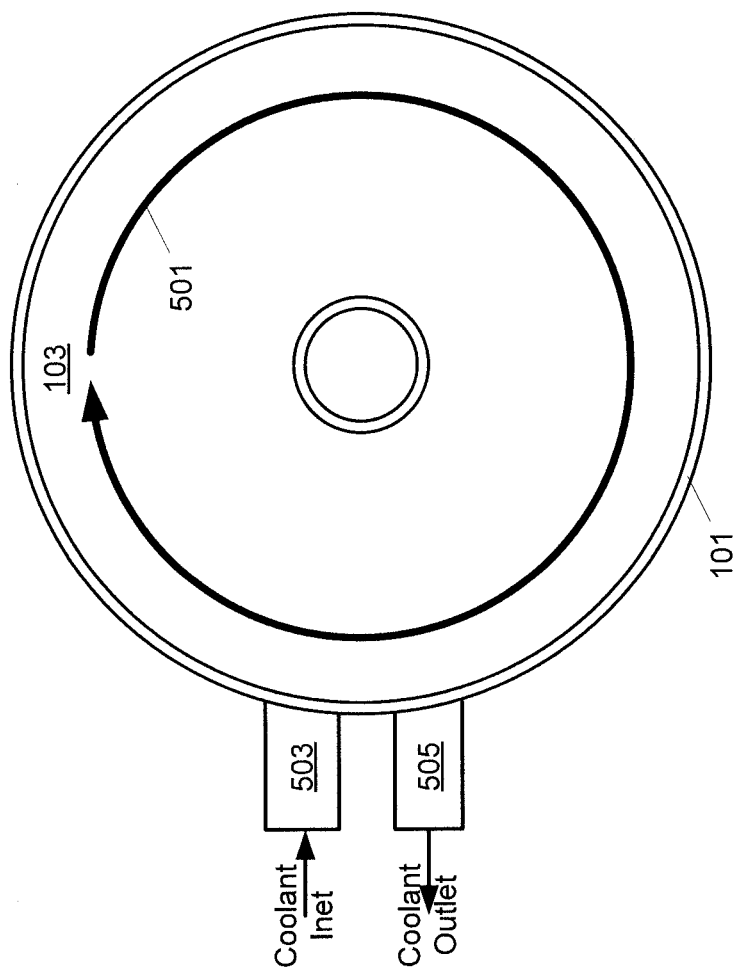
FIG. 5 depicts a front perspective view of the heatsink and light emitting materials of FIG. 1, as well as a path of excitation light impinging on the light emitting material, according to non-limiting implementations.

Furthermore, as depicted in FIGS. 2-4, as optics 107 rotate with respect to light emitting material 103, hence excitation light 203 inscribes a circular path on light emitting material 103, as depicted in FIG. 5. Indeed, FIG. 5 depicts a front perspective view of heatsink 101 and light emitting material 103, as well as a circular path 501 that excitation light 203 impinges on light emitting material 103. Hence, production of light 303 also occurs on path 501, as well as heat production and dissipation into heatsink 101; as heatsink 101 does not rotate, heatsink 101 can comprise a static waterblock with a static seal, which can comprise a coolant inlet 503 and a coolant outlet 505.

Furthermore, while light emitting material 103 is depicted in FIGS. 1-5 as covering a substantial area of a surface of heatsink 101, light emitting material 103 can be located in a band, for example a circular band, around path 501. Indeed, light emitting material 103 can have any geometry on heatsink 101, though a portion of light emitting material 103 generally has circular symmetry in the area of path 501.

Persons skilled in the art will appreciate that there are yet more alternative implementations and modifications possible. For example, system 100 can further comprise apparatus for linearly displacing heatsink 101 relative to optics 107; such apparatus (not depicted) can include a linear motor and the like which can be configured to linearly move one or more of frame 111 and heatsink 101 in one or more directions parallel to each other so that path 501 becomes a spiral, and the like, to dissipate heat over a larger area of heatsink 101. As heatsink 101 does not rotate, even when linearly translated, a static water seal can be used to with a waterblock of heatsink 101, as in FIG. 5.

In yet further implementations, the light emitting material can comprise red light emitting segments and green light emitting segments of light emitting material. For example, attention is next directed to FIG. 6 which depicts a heatsink 601, similar to heatsink 101, and light emitting materials 603R, 603G, arranged in circularly consecutive segments on heatsink 601. Light emitting material 603R is configured to emit red light while light emitting material 603G is configured to emit green light. Light emitting materials 603R, 603G will be interchangeably referred to hereafter as light emitting materials 603. Heatsink 601 and light emitting materials 603 can be used in system 100 in place of heatsink 101 and light emitting materials 103 to produce a mixture of red and green light. While light emitting materials 603 are depicted in wedges, light emitting materials 603 can alternatively be portions of a band of light emitting materials. Further, while red and green light emitting materials are depicted, in other implementations, light emitting materials 603 can include red, green and blue light emitting materials so that when light from all three light emitting materials are combined, white light is produced.

Figure 7:
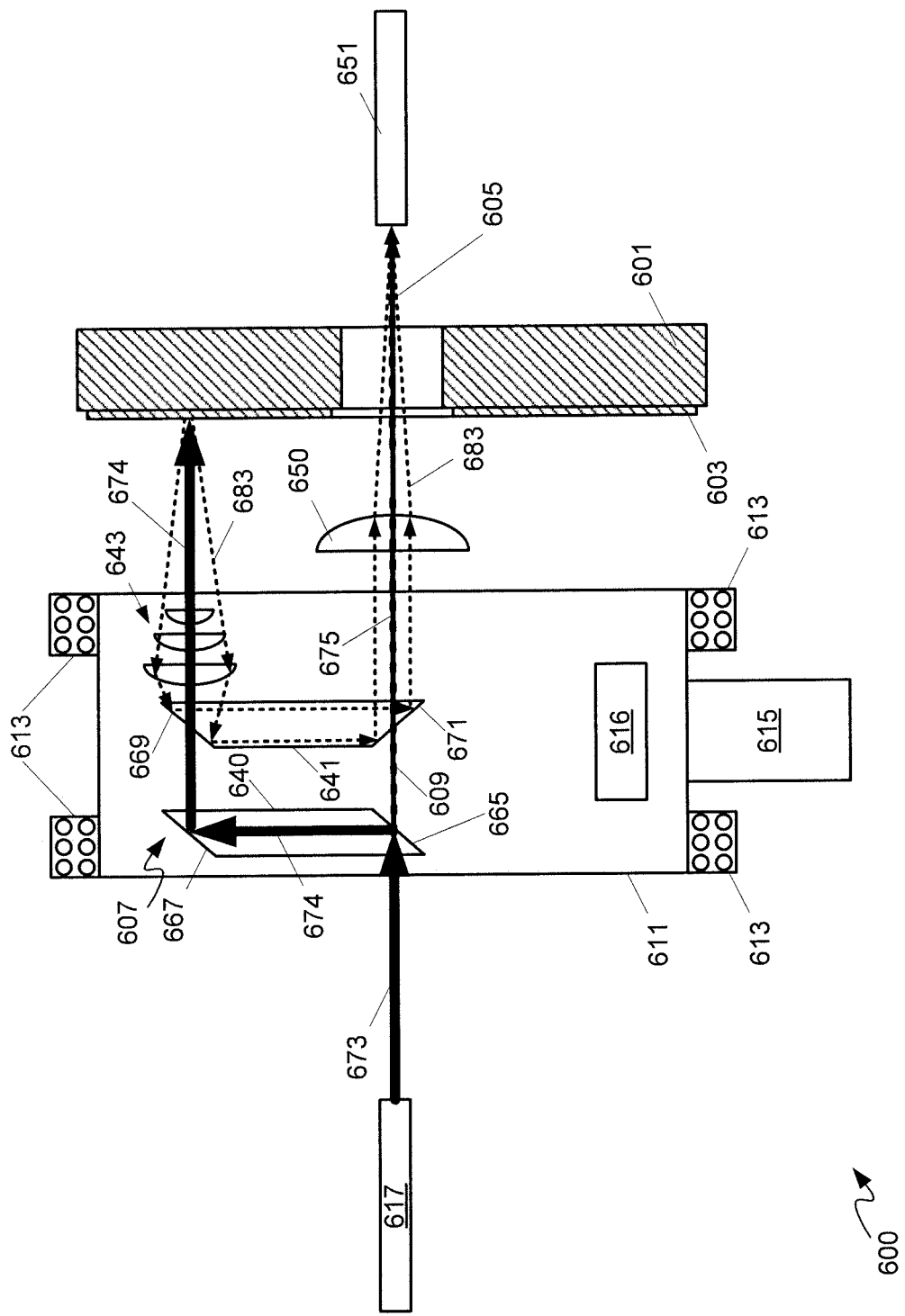
FIG. 7 depicts a side view, and a partial cross-sectional view, of an alternative system that includes a rotationally static light emitting material with rotating optics, according to non-limiting implementations.

Alternatively, heatsink 601 and light emitting materials 603R, 603G can be used in a system similar to system 100 to produce white light. For example, attention is next directed to attention is next directed to FIG. 7, which depicts a system 600 that is substantially similar to system 100, with like elements having like numbers, but starting with a "6" rather than a "1". Hence, system 600 comprises: heatsink 601; least one light emitting material 603 (i.e. light emitting materials 603R, 603G) located on heatsink 601; and, optics 607 configured to rotate relative to at least one light emitting material 603 around a rotational axis 609 that is coaxial with axis 605 of at least one light emitting material 603. System 600 further comprises a frame 611, bearings 613, a motor 615, a counterbalance 616, a laser 617 (only once laser is depicted for simplicity, however in other implementations, system 600 can comprise two or more lasers), one or more lenses 650 and an integrator 651. Laser 617 can comprise a blue laser emitting blue excitation light 673.

Optics 607 comprises prisms 640, 641, having reflection surfaces 665, 667, 669, 671, and lenses 643, similar to lenses 143. Reflection surfaces 667, 669 are respectively similar to reflection surfaces 207, 209. However, reflection surface 665 is configured to reflect a portion 674 of excitation light 673 emitted from laser 617, and transmit a portion 675 there through towards surface 671; and surface 671 is aligned with surface 665 along rotational axis 609, and surface 671 is configured to reflect light 683 emitted from light emitting material 603 (i.e. red light and green light) and transmit portion 675 (i.e. blue light) there through, to combine with light 683, at least at integrator 651, to produce white light for use, by example, in a projection system. Reflection surfaces 665, 671 are otherwise respectively similar to reflection surfaces 205, 211.

Figure 8:
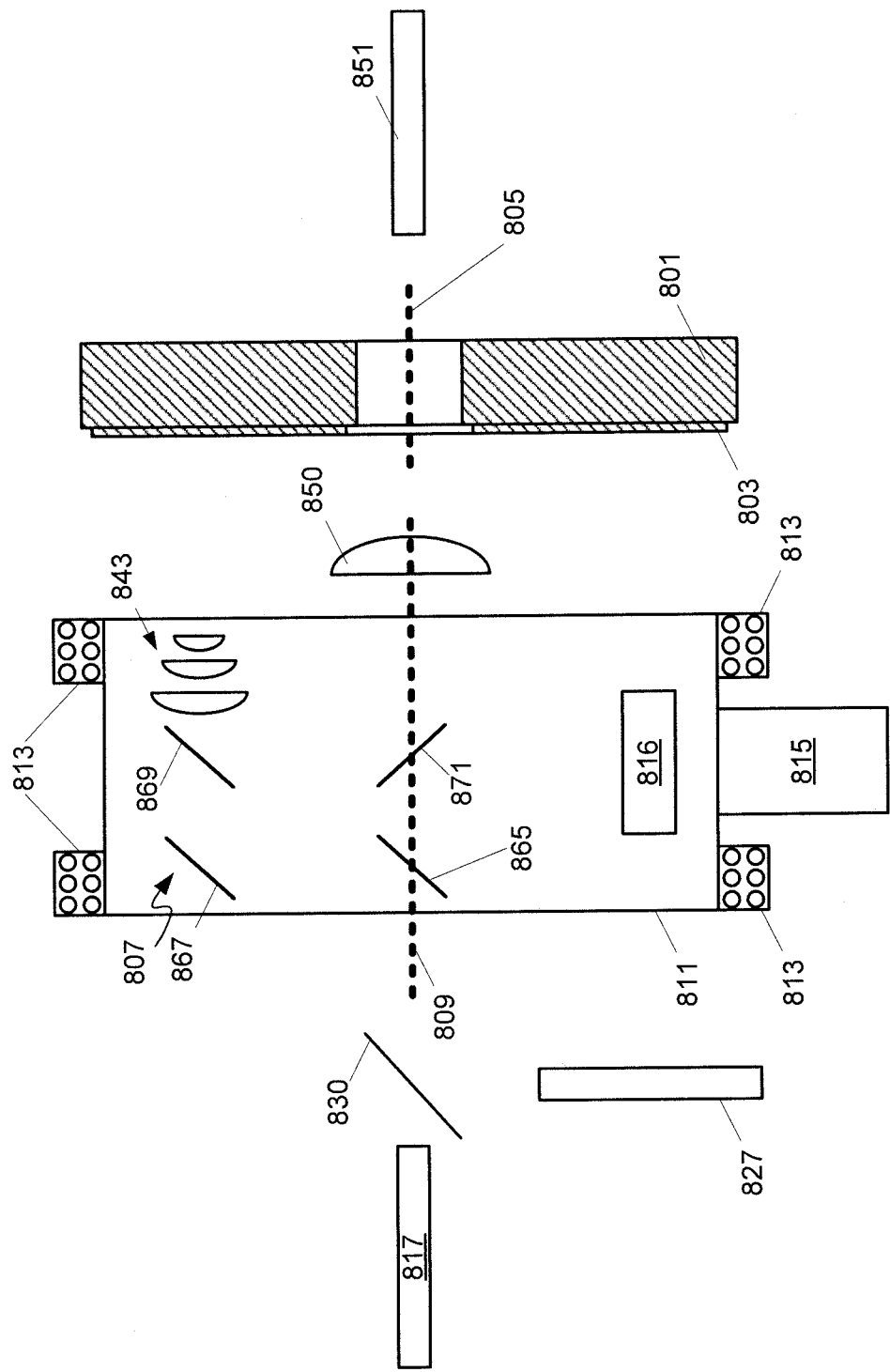
FIG. 8 depicts a side view, and a partial cross-sectional view, of an alternative system that includes a rotationally static light emitting material with rotating optics, according to non-limiting implementations.

In yet further implementations, prisms 140, 141 can be replaced with one or more mirrors and one or more dichroic mirrors. For example, attention is next directed to FIG. 8, which depicts a system 800 that is substantially similar to system 100, with like elements having like numbers, but starting with an "8" rather than a "1". Hence, system 800 comprises: a heatsink 801; at least one light emitting material 803 located on heatsink 801; and, optics 807 configured to rotate relative to at least one light emitting material 803 around a rotational axis 809 that is coaxial with axis 805 of at least one light emitting material 803. System 800 further comprises a frame 811, bearings 813, a motor 815, a counter-balance 816, lasers 817, 827, stationary optics 830, one or more lenses 850 and an integrator 851.

In contrast to system 100, however, optics 807 comprises lenses 843, similar to lenses 143, and mirrors 865, 867, 869, 871, rather than prisms 140, 141. Mirrors 865, 867, 869, 871 are located at positions respectively similar to surfaces 205, 207, 209, 211; mirrors 865, 867 are displaced by a distance similar to length of prism 140, and mirrors 869, 871 are displaced by a distance similar to a length of prism 141. Further, while each of mirrors 865, 867, 871 can comprise a reflective mirror and/or a dichroic mirror, mirror 869 comprises a dichroic mirror which transmits excitation light as it reflects from mirror 867 to lenses 843, and reflects light received from light emitting material 803 through lenses 843 towards mirror 871. Hence, mirrors 865, 867, 869, 871 have similar functionality as prisms 140, 141, and can be more efficient than prisms 140, 141 as excitation light from lasers 117, 127 travel through air there between rather than a solid optical material such as glass and/or plastic and/or the like.

Heretofore, implementations have been described where rotating optics comprise two prisms and/or four mirrors, however other optics are within the scope of the present specification.

Figure 9:
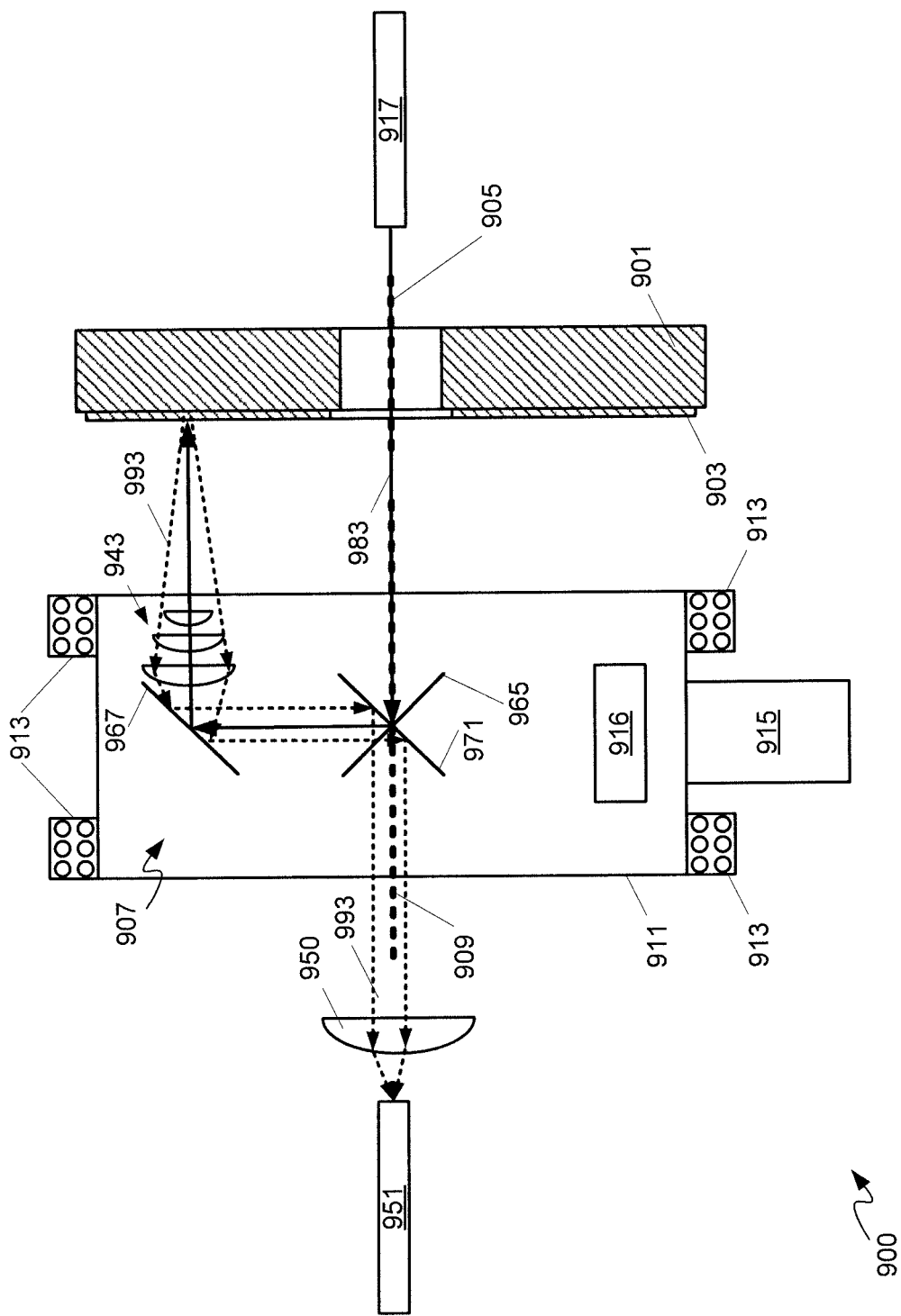
FIG. 9 depicts a side view, and a partial cross-sectional view, of an alternative system that includes a rotationally static light emitting material with rotating optics, according to non-limiting implementations.

For example, attention is next directed to FIG. 9, which depicts a system 900 that is substantially similar to system 100, with like elements having like numbers, but starting with a "9" rather than a "1". Hence, system 900 comprises: a heatsink 901; at least one light emitting material 903 located on heatsink 901; and, optics 907 configured to rotate relative to at least one light emitting material 903 around a rotational axis 909 that is coaxial with axis 905 of at least one light emitting material 903. System 900 further comprises a frame 911, bearings 913, a motor 915, a counter-balance 916, one or more lasers 917, one or more lenses 950 and an integrator 951. In contrast to system 100, however, laser 917 is located on a side of heatsink 901 opposite optics 907, and lens 950 and integrator 951 are located on same side of heatsink 901 as optics 901; in other words, as compared to laser 117 and integrator 151 of system 100, in system 900, locations of optics 907 and integrator 951 have been exchanged. Hence, a path of excitation light 983 (solid line in FIG. 9) from laser 917 is through an aperture of heatsink 601.

Furthermore, optics 907 comprise: lenses 943, similar to lenses 143, dichroic mirrors 965, 971 and mirror 967 rather than prisms 140, 141. Dichroic mirrors 965, 971 can also be referred as a dichroic structure. Dichroic mirror 965 is located on rotational axis 905, and is aligned with laser 917 so that dichroic mirror 965 reflects laser 983 from laser 917 away from rotational axis 905 towards mirror 967, which in turn reflects excitation light 983 through lenses 943 to light emitting material 903. Light emitting material 903 is then excited and emits light 993, similar to light 303, which collected by lenses 943, and conveyed to mirror 967, which reflects light 983 towards dichroic mirror 971, which reflects light 983 along rotational axis 909 and out of frame 911 towards lens 950, which convey and/or focus light 993 onto an input of integrator 951.

Hence, each of dichroic mirrors 965, 971 are located on rotational axis 909, about centred on rotational axis 909, and are each at about 45° to rotational axis 909. Further, dichroic mirror 965 is reflective of excitation light 983, and transparent to light 983 so that light 983 is not transmitted back towards laser 917. In some implementations, dichroic mirror 965 is partially transmissive to excitation light 983 so that a portion of excitation light 983 is mixed with light 993 at least at integrator 951, as in system 600. Dichroic mirror 971 is reflective of light 993 and transmissive to excitation light 983.

In some implementations, a lens and the like can be located on a path of excitation light 983 between laser 917 and dichroic mirror 965 to better focus excitation light 983 onto dichroic mirror 965. In yet further implementations system 900 can include (in addition to lens 950) a mirror, and the like for reflecting light 993 (and alternatively a portion of excitation light 983) towards collection optics, and the like.

Heretofore, implementations have been discussed in which at least one laser and collection optics are on opposite sides of a heatsink and rotating optics; however, the present specification includes implementations where at least one laser and collection optics can be on a same side of a heatsink and rotating optics.

Figure 10:
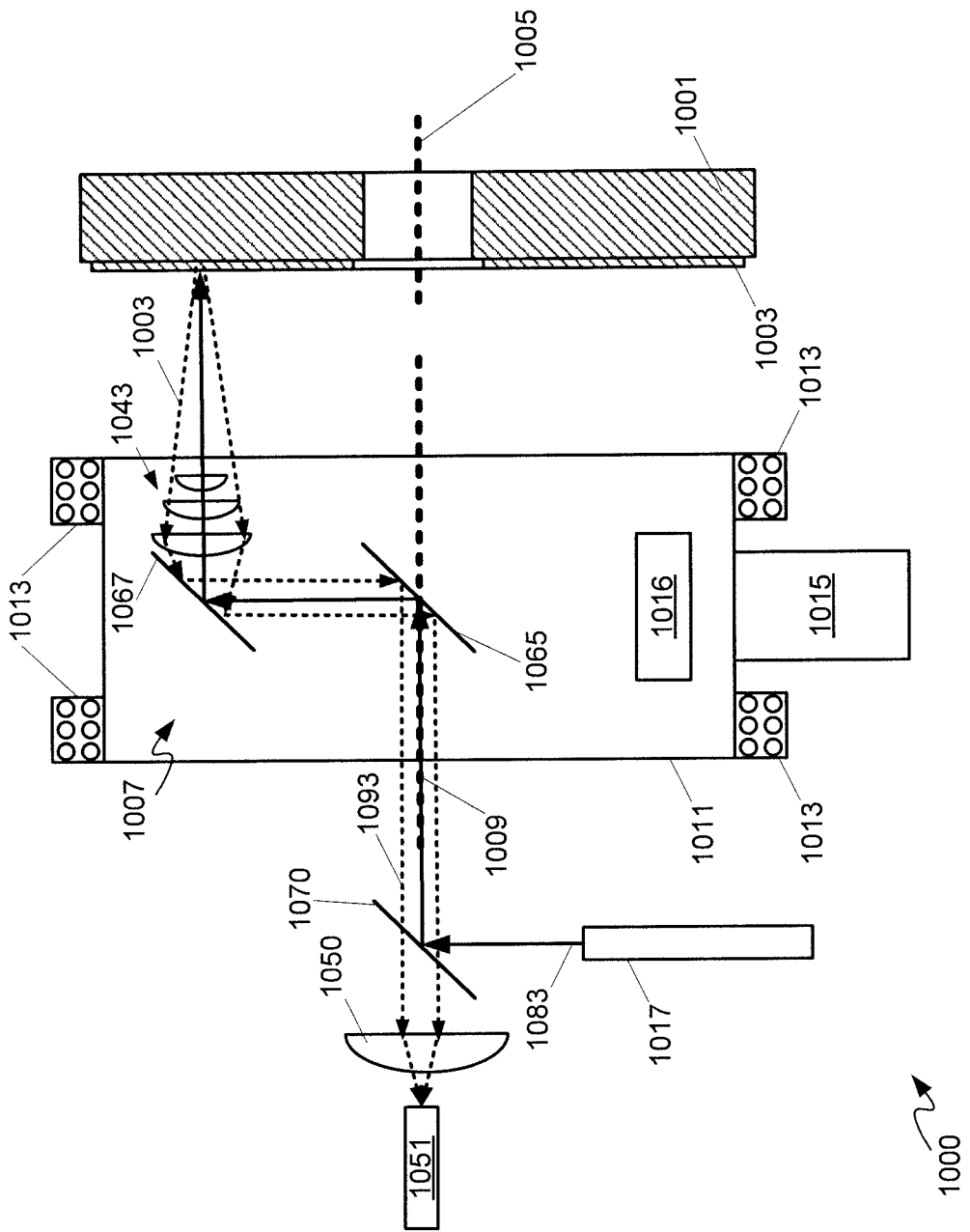
FIG. 10 depicts a side view, and a partial cross-sectional view, of an alternative system that includes a rotationally static light emitting material with rotating optics, according to non-limiting implementations.

For example, attention is next directed to FIG. 10, which depicts a system 1000 that is substantially similar to system 100, with like elements having like numbers, but starting with a "10" rather than a "1". Hence, system 1000 comprises: a heatsink 1001; at least one light emitting material 1003 located on heatsink 1001; and, optics 1007 configured to rotate relative to at least one light emitting material 1003 around a rotational axis 1009 that is coaxial with axis 1005 of at least one light emitting material 1003. System 1000 further comprises a frame 1011, bearings 1013, a motor 1015, a counter-balance 1016, one or more lasers 1017, one or more lenses 1050 and an integrator 1051. In contrast to system 100, however, laser 1017, one or more lenses 1050 and an integrator 1051 are located on a same side of heatsink 1001.

System further comprises a stationary dichroic mirror 1070 located on an intersection of a path of excitation light 1083 emitted from laser 1017, and a path of light 1093 emitted from light emitting material 1003 and conveyed to integrator 1051 by optics 1007, as described hereafter, and rotational axis 1009. In some implementations, system 1000 can include at least dichroic structure configured to reflect a portion of excitation light 1083 towards integrator 1051 to combine with light 1093, and transmit a remaining portion of excitation light 1083 towards optics 1007, as in system 600.

Optics 1007 comprise a mirror 1065 located on rotational axis 1009 (and centred on rotational axis 1009) and a minor 1067 located perpendicularly from rotational axis 1009, minor 1065 configured to reflect excitation light 1083 towards minor 1067, and reflect light 1093 received from mirror 1067 towards integrator 1051 and/or collection optics, and the like. Mirror 1067 is configured to reflect excitation light 1083 reflected from minor 1065 towards light emitting material 1003, and reflect light 1093 received from light emitting material 1003 (as collected by lenses 1043), towards mirror 1065. Each of minors 1065, 1067 is at about 45° to rotational axis 1009. In some implementations, mirrors 1065, 1067 can be replaced by a prism, as in system 100.

In other words, a wide variety of rotating optics are within the scope of present implementations, as long as excitation light is received along a rotational axis thereof, and light collected from a light emitting material is conveyed back to the rotational axis for emission there along.

The present specification can further include at least two light emitting materials located at different portions of a heatsink, each of the at least two light emitting materials being circularly symmetric about an axis, and rotating optics can be further configured to convey excitation light to each of the at least two light emitting materials as the rotating optics are rotating. Furthermore, the rotating optics can be further configured to: convey the excitation light to at least two different portions (e.g. one or more locations) of the at least one light emitting material; collect the light emitted from the at least two different portions excited by the excitation light; and convey the light collected from the at least two different portions to a rotational axis for emission there along.

Figure 11:
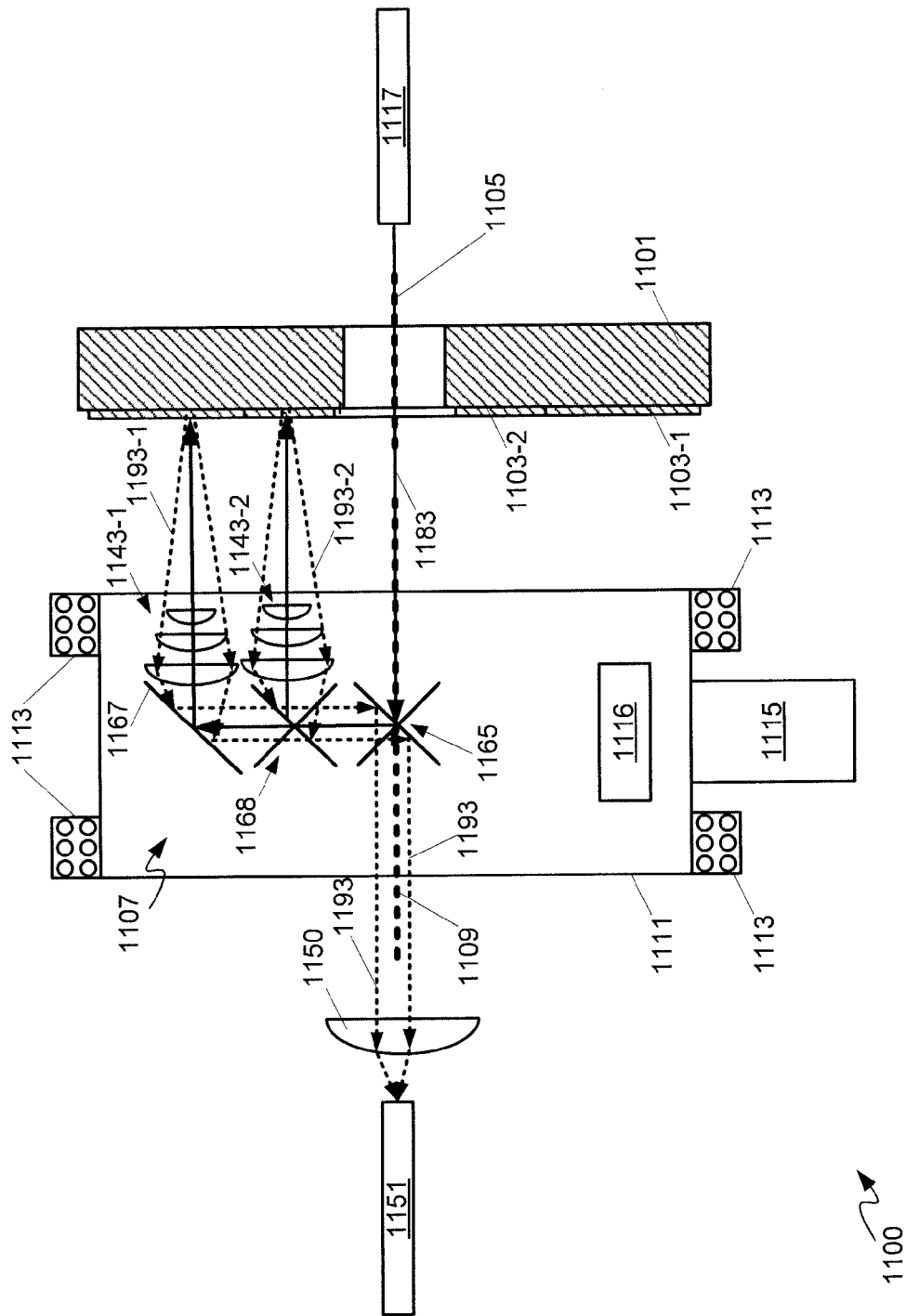
FIG. 11 depicts a side view, and a partial cross-sectional view, of an alternative system that includes a rotationally static light emitting material with rotating optics, according to non-limiting implementations.
Figure 12:
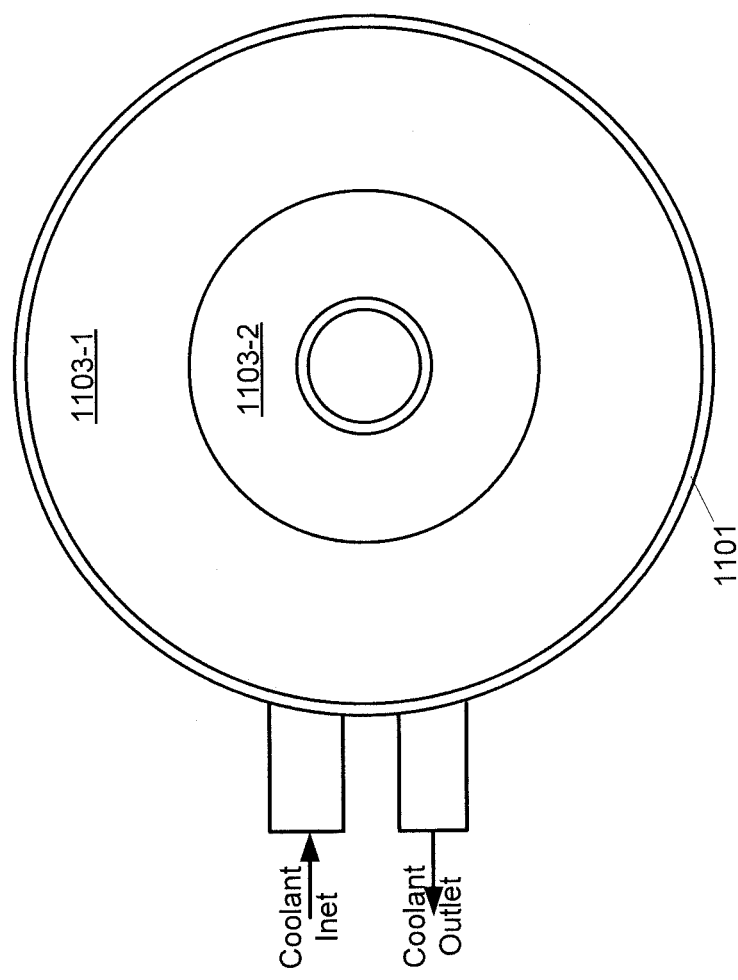
FIG. 12 depicts a front perspective view of an alternative heatsink and light emitting materials, according to non-limiting implementations.

For example, attention is next directed to FIG. 11, which depicts a system 1100 that is substantially similar to system 900, with like elements having like numbers, but starting with an "11" rather than a "9". Hence, system 1100 comprises: a heatsink 1101; at least one light emitting material 1103-1, 1103-2 located on heatsink 1101; and, optics 1107 configured to rotate relative to at least one light emitting material 1103-1, 1103-2 around a rotational axis 1109 that is coaxial with axis 1105 of at least one light emitting material 1103-1, 1103-2. System 1100 further comprises a frame 1111, bearings 1113, a motor 1115, a counter-balance 1116, one or more lasers 1117, one or more lenses 1150 and an integrator 1151. In contrast to system 900, however, system 1100 comprises two light emitting materials 1103-1, 1103-2, each circularly symmetric about axis 1105. For example, attention is directed to FIG. 12, which depicts a front perspective view of heatsink 1101, which is similar to heatsink 901 and/or heatsink 101, and light emitting materials 1103-1, 1103-2, each located at different radii around axis 1105, with light emitting material 1103-1 having larger radii than light emitting material 1103-2. In yet further implementations, system 1100 can include more than two light emitting materials with circular symmetry on heatsink 1101, each at different radii.

With further reference to FIG. 11, optics 1107 is generally configured to: convey excitation light 1183 from laser 1117 to at least two light emitting materials 1103-1, 1103-2 at different radii from rotational axis 1109; collect light 1193-1, 1193-2 emitted from the at least two light emitting materials 1103-1, 1103-2 excited by excitation light 1183; and convey light 1193-1, 1193-2 collected from at least two light emitting materials 1103-1, 1103-2 to rotational axis 1109 for emission there along.

For example, optics 1107 comprise a dichroic structure 1165 which is similar to the combination of dichroic mirrors 965, 971, a mirror 1167, similar to mirror 967, and lenses 1143-1, similar to lenses 943; further mirror 1167 and lenses 1143-1 are configured to receive excitation light 1183 from dichroic structure 1165, convey excitation light 1183 to light emitting material 1103-1, collect light 1193-1 from light emitting material 1103-1 emitted when excited by excitation light 1183, and convey light 1193-1 to dichroic structure 1165, which conveys light 1193-1 to integrator 1151.

However, in contrast to optics 907, optics 1107 further comprise a second dichroic structure 1168 located between dichroic structure 1165 and mirror 1167, on a path of excitation light 1183 there between, and second lenses 1143-2. Second dichroic structure 1168 is configured to convey a portion of excitation light 1183 towards light emitting material 1103-2 (and lenses 1143-2), and convey a remaining portion of excitation light 1183 to mirror 1167. Hence, dichroic structure 1168 is located between dichroic structure 1165 and mirror 1167 at a radius that is similar to a radius of light emitting material 1103-2. Further, lenses 1143-2 are configured to collect light 1193-2 emitted from light emitting material 1103-2, and convey light 1193-2 to dichroic structure 1168. Dichroic structure 1168 is hence further configured to reflect light 1193-2 to dichroic structure 1165 and/or combine light 1193-1 received from mirror 1167 and convey combined light 1193 (comprising light 1193-1, 1193-2) to integrator 1151.

Indeed, in yet further implementations, system 1100 can comprise more than two light emitting materials located on heatsink 1101 at different radii, and optics 1107 can include corresponding lenses and a dichroic and/or reflective structure for each located between mirror 1167 and dichroic structure 1165.

In yet further implementations, rotating optics can be configured to convey excitation light to at least two different portions of light emitting material, for example, in different directions from a rotational axis of the rotating optics at a same or different radius.

Figure 13:
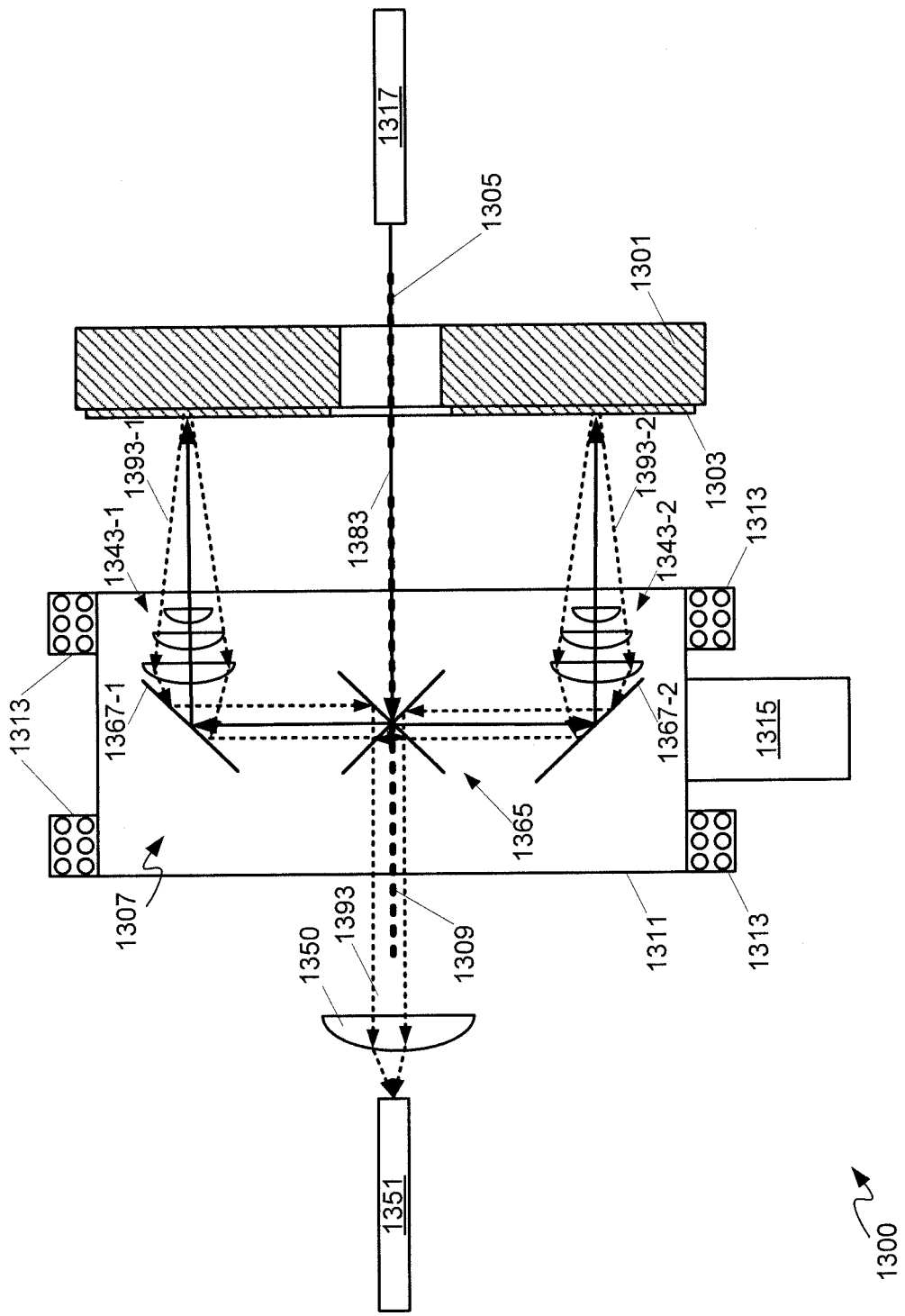
FIG. 13 depicts a side view, and a partial cross-sectional view, of an alternative system that includes a rotationally static light emitting material with rotating optics, according to non-limiting implementations.

For example, attention is next directed to FIG. 13, which depicts a system 1300 that is substantially similar to system 900, with like elements having like numbers, but starting with a "13" rather than a "9". Hence, system 1300 comprises: a heatsink 1301; at least one light emitting material 1303 located on heatsink 1301; and, optics 1307 configured to rotate relative to at least one light emitting material 1303 around a rotational axis 1309 that is coaxial with axis 1305 of at least one light emitting material 1303. System 1300 further comprises a frame 1311, bearings 1313, a motor 1315, one or more lasers 1317, one or more lenses 1350 and an integrator 1351. In contrast to system 900, however, system 1300 comprises one or more light emitting materials 1303 circularly symmetric about axis 1305.

Further, in contrast to optics 907, optics 1307 is generally configured to: convey excitation light 1383 from laser 1317 to at least two different portions of light emitting material 1303; collect light 1393-1, 1393-2 emitted from the at least two different portions of light emitting material 1303 excited by excitation light 1383; and convey light 1393-1, 1393-2 collected from the at least two different portions of light emitting material 1303 to rotational axis 1309 for emission there along.

For example, optics 1307 comprise a dichroic structure 1365 which is similar to the combination of dichroic mirrors 965, 971, however, dichroic structure 1365 is configured to convey excitation light 1383 in two different directions: as depicted, dichroic structure 1365 is configured to convey excitation light 1383 in two different directions about 180° from each other, however in other implementations, dichroic structure 1365 can be configured to convey excitation light 1383 in directions different from at about 180° to each other.

Optics 1307 further comprises a mirror 1367-1, similar to mirror 967, and lenses 1343-1, similar to lenses 943. However, optics 1307 further comprises a mirror 1367-2, similar to mirror 967, and lenses 1343-2, similar to lenses 943, however located along a different path of excitation light 1383 than mirror 1367-1 and lenses 1343-1. Mirror 1367-2 and lenses 1343-2 otherwise have similar respective functionality as mirror 1367-2 and lenses 1343-2. Hence, light 1393-1, 1393-2 is produced by light emitting material 1303 at locations respectively adjacent to lenses 1343-1, 1343-2. Lenses 1343-1 collect light 1393-1, and lenses 1343-2 collect light 1393-2 from light emitting material 1303. Further, each of mirrors 1367-1, 1367-2 respectively conveys light 1393-1, 1393-2 to dichroic structure 1365, which combines light 1393-1, 1393-2 and reflects combined light 1393 to integrator 1351 and/or collection optics. Dichroic structure 1365 hence comprises a combination of dichroic mirrors which splits excitation light 1383 into portions, and reflects each portion in different directions, and receives and combines the resulting light 1393-1, 1393-2 emitted from light emitting material 1303.

Furthermore mirrors 1367-1, 1367-2 can be located at the same radius or different respective radii so that different regions of light emitting material 1303 are excited by excitation light 1383. When mirrors 1367-1, 1367-2 are located at the same radius, but 180° from each other, optics 1307 can have circular symmetry and a counter-balance can be eliminated from system 1300, as compared to previously described systems. However, when mirrors 1367-1, 1367-2 are located at different respective radii, and/or at angles different from 180°, and/or when optics 1307 do not have circular symmetry, system 1300 can further include a counter-balance as in previously described systems.

It is yet further appreciated that implementations described in FIGS. 1-13 can be combined as desired: for example, rotating optics can convey excitation light to different regions of a light emitting material in a same and/or different directions, to one or more light emitting materials at a same or different radii, using mirrors, dichroic mirrors, prisms and the like, with lasers and collection optics located on a same or different sides.

In systems described heretofore, a surface of a heatsink and at least one light emitting material comprises an annulus symmetrical about an axis, and the optics are further configured to rotate along the surface. Specifically, heatsinks described heretofore comprise comprises toroids symmetrical about the axis. In addition, rotating optics described heretofore are configured to one or more of: receive excitation light through the toroid; and convey the light collected from the at least one light emitting material through the toroid. In some implementations, the rotating optics are further configured to receive the excitation light from a first side of the optics and convey the light collected from the at least one light emitting material back through the first side. In yet further implementations, the rotating optics are further configured to receive the excitation light from a first side of the optics and convey the light collected from the at least one light emitting material through a second side opposite the first side.

However, other geometries are within the scope of present implementations. For example, a heatsink can comprise a cylinder, with at least one light emitting material located on an interior surface of the cylinder, and the optics (similar to rotating optics described previously) can be configured to rotate within the cylinder.

Figure 14:
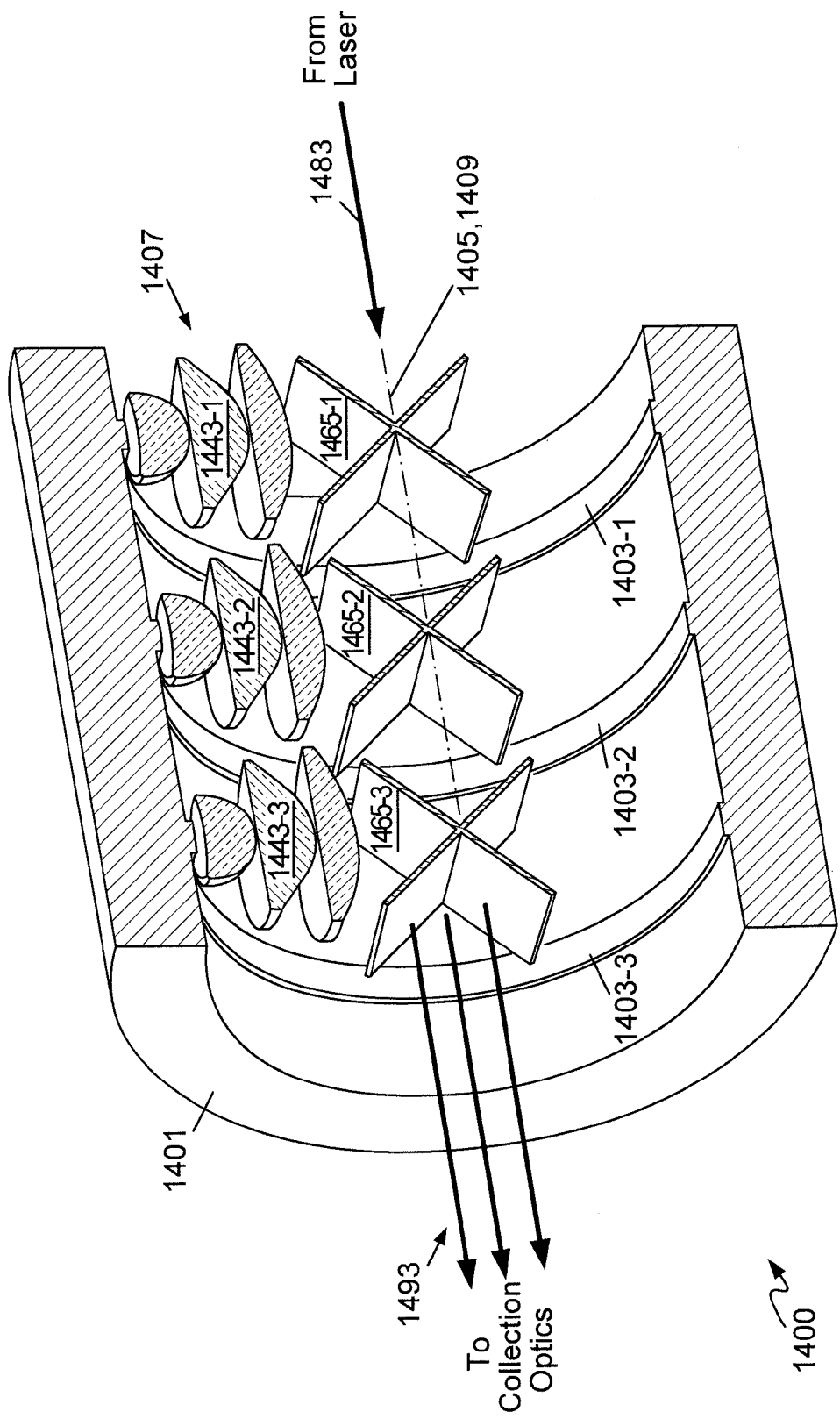
FIG. 14 depicts a side view, and a partial cross-sectional view, of an alternative system that includes a rotationally static light emitting material with rotating optics, according to non-limiting implementations.

For example, attention is next directed to FIG. 14 which depicts a partial cut away perspective view of a system 1400 comprising: a cylindrical heatsink 1401; at least one light emitting material 1403-1, 1403-2, 1403-3 located on an interior of cylindrical heatsink 1401, at least a portion of at least one light emitting material 1403-1, 1403-2, 1403-3 being circularly symmetrical around an axis 1405, for example a longitudinal axis of heatsink 1401, heatsink 1401 and the at least one light emitting material 1403-1, 1403-2, 1403-3 being rotationally fixed; and optics 1407 configured to rotate relative to at least one light emitting material 1403-1, 1403-2, 1403-3 around a rotational axis 1409 that is coaxial with axis 1405 of at least one light emitting material 1403-1, 1403-2, 1403-3. At least one light emitting material 1403-1, 1403-2, 1403-3 will be interchangeably referred to hereafter collectively as light emitting materials 1403 and generically as a light emitting material 1403. While system 1400 comprises three light emitting materials 1403 disposed with circular symmetry on an interior of heatsink 1401, other implementations can comprise fewer than three light emitting materials 1403 or more than three light emitting materials 1403. As depicted, the three light emitting materials 1403 emit red, green and blue light when excited by excitation light.

While not depicted in FIG. 14, system 1400 further comprises at least one laser, similar to laser 117, and collection optics, which can be similar to lens 150, integrator 151, etc. While also not depicted, system 1400 can further comprise a motor, a body and/or a frame comprising optics 1407, bearings, and a counterbalance, the motor configured to rotate optics about rotational axis 1409.

Optics 1407 comprises lenses 1443-1, 1443-2, 1443-3, each similar to lenses 143, and dichroic structures 1465-1, 1465-2, 1465-3. Lenses 1443-1, 1443-2, 1443-3 will be interchangeably referred to hereafter collectively as lenses 1443 and generically as lenses 1443. Similarly, dichroic structures 1465-1, 1465-2, 1465-3 will be interchangeably referred to hereafter collectively as dichroic structures 1465 and generically as a dichroic structure 1465. Optics 1407 comprises a set of lenses 1443 and a corresponding dichroic structure 1465 for each light emitting material 1403. Each dichroic structure 1465 is similar to dichroic structure 1365, and is located on, and aligned with, rotational axis 1409, however each dichroic structure 1465, other than dichroic structure 1465-3, is at least partially transmissive of excitation light 1483 so that excitation light is distributed to each dichroic structure 1465 along rotational axis 1409. Each dichroic structure 1465 then reflects excitation light 1483 to respective light emitting material 1403, through respective lenses 1443, where excitation light 1483 excites the respective light emitting material 1403 to emit light 1493. Light 1493 is collected by respective lenses 1443, and conveyed to the respective dichroic structure 1465, which reflects light 1493 along rotational axis 1409 towards collection optics. Hence, each dichroic structure 1465 is configured to transmit light 1493 received from a previous dichroic structure.

Further, in implementations that do not include a blue light emitting material, a last dichroic structure 1465 (e.g. dichroic structure 1465-3) can be at least partially transparent to excitation light 1483 so that blue excitation light can be mixed with green light, red light, and/or any colour produced by light emitting materials 1403 to produce white light, as in system 600, including, but not limited to yellow light, infrared light and the like.

As optics 1407 rotate about the interior of heatsink 1401, excitation light 1483 excites light emitting materials 1403 in a circular manner thereby distributing heat production on onto the interior surface of heatsink 1401.

Furthermore, while heatsink 1401 is rotationally fixed, heatsink 1401 can be linearly translated to increase the surface area of light emitting materials 1403 which are excited, and hence the area of heat distribution.

In other implementations where a heatsink comprises a cylinder, at least one light emitting material can be located on an exterior surface of the cylinder, and rotating optics can be configured to rotate around the exterior surface of the cylinder; in other words, such systems are similar to system 1400, however the rotating optics rotate about the exterior; in such implementations, the rotating optics include mirrors for accepting excitation light along a rotation axis, conveying the excitation light to a dichroic structure, and conveying light emitted by the light emitting materials, as received from the dichroic structure.

Figure 15:
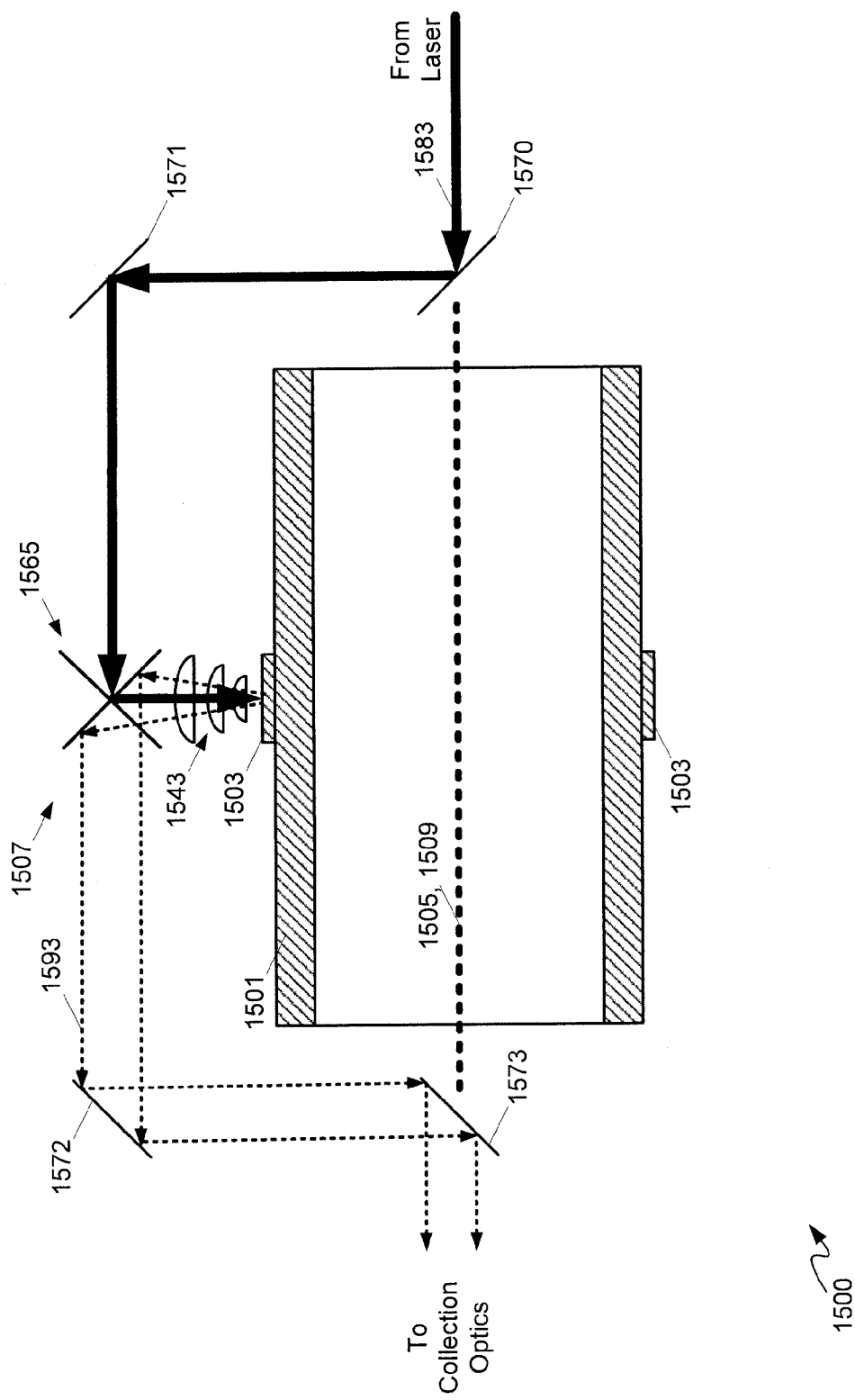
FIG. 15 depicts a side view, and a partial cross-sectional view, of an alternative system that includes a rotationally static light emitting material with rotating optics, according to non-limiting implementations.

For example, attention is next directed to FIG. 15 which depicts a partial cut away perspective view of a system 1500 comprising: a cylindrical heatsink 1501; at least one light emitting material 1503 located on an exterior of cylindrical heatsink 1501, at least a portion of at least one light emitting material 1503 being circularly symmetrical around an axis 1505, for example a longitudinal axis of heatsink 1501, heatsink 1501 and the at least one light emitting material 1503 being rotationally fixed; and optics 1507 configured to rotate relative to at least one light emitting material 1503 around a rotational axis 1509 that is coaxial with axis 1505 of at least one light emitting material. While system 1500 is depicted with one band of light emitting material 1503 disposed with circular symmetry on an exterior of heatsink 1501, other implementations can comprise more than one light emitting material 1503, as in system 1400. Furthermore, the band of light emitting material 1503 can comprise more than one light emitting material arranged around the band.

While not depicted in FIG. 15, system 1500 further comprises at least one laser, similar to laser 117, and collection optics, which can be similar to lens 150, integrator 151, etc. While also not depicted, system 1500 can further comprise a motor, a body and/or a frame comprising optics 1507, bearings, and a counterbalance, the motor configured to rotate optics about rotational axis 1509.

Optics 1507 comprises lenses 1543, each similar to lenses 143, dichroic structure 1565, and mirrors 1570, 1571, 1572, 1573. While only one set of lenses 1543 and one corresponding dichroic structure 1565 is depicted, in implementations where system 1500 comprises more than one band of light emitting material, system 1500 can comprise a set of lenses and a dichroic structure for each band of light emitting material. Dichroic structure 1565 is similar to dichroic structure 1365, and is located on, and aligned with, rotational axis 1509; in some implementations dichroic structure 1565 can be at least partially transmissive of excitation light 1583 so that at least a portion of excitation light 1583 is conveyed out of optics 1507. Where more than one dichroic structure and more than one band of light emitting material is present, the properties of the dichroic structures can be similar to dichroic structures 1465.

In any event, excitation light 1583 is received at mirror 1570, which is located on, and is centred rotational axis 1509; mirror 1570 is configured to reflect excitation light 1583 towards mirror 1571, which in turn reflects excitation light to dichroic structure 1565. Dichroic structure 1565 directs at least a portion of excitation light 1583 to light emitting material 1503, through lenses 1543, and light 1593 emitted by light emitting material 1503 is collected by lenses 1543 which conveys light 1593 to dichroic structure 1565. Dichroic structure 1565 directs light 1593 to mirror 1572, which reflects light 1593 (and alternatively a portion of excitation light 1583 transmitted by dichroic structure 1565) to mirror 1573 located on, and centred on, rotational axis 1509. Mirror 1573 directs light 1593 out of optics 1507 towards collection optics.

In alternative implementations, mirrors 1570, 1573 can be at least partially transmissive to excitation light 1583, and a portion of excitation light 1583 is transmitted through mirrors 1570,1573, to combine excitation light 1583 with light 1593.

As described above optics 1507 (including mirrors 1570, 1571, 1572, 1573) rotate about rotational axis 1509 so that an input path (and alternatively an output path) of excitation light 1583 and an output path of light 1593 are fixed along rotational axis 1509, while light emitting material 1503 is excited along ifs circumference to distribute heat production on heatsink 1501.

Figure 16:
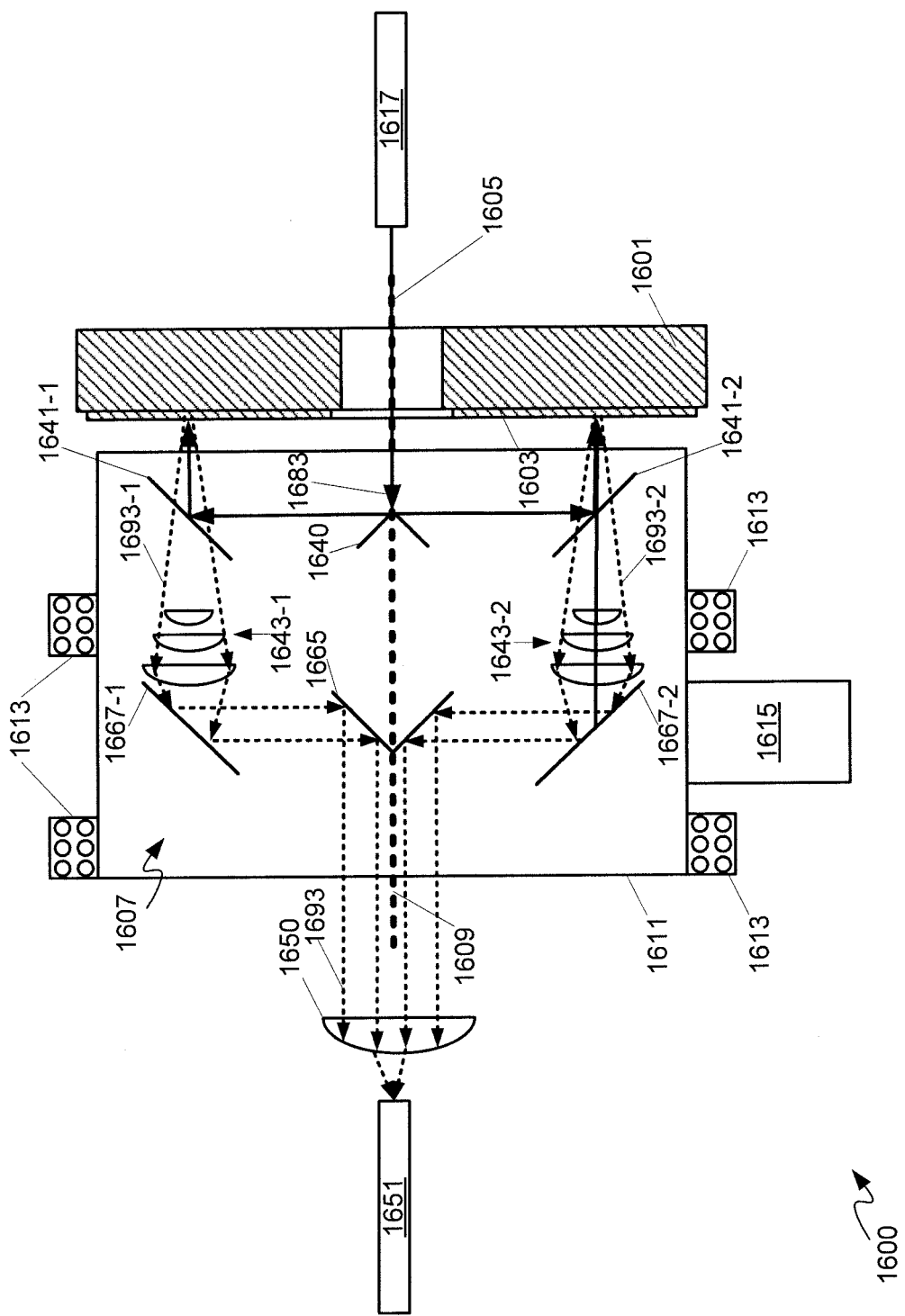
FIG. 16 depicts a side view, and a partial cross-sectional view, of an alternative system that includes a rotationally static light emitting material with rotating optics, according to non-limiting implementations.

Persons skilled in the art will appreciate that there are yet even further more alternative implementations and modifications possible. For example, attention is next directed to FIG. 16 which depicts a system 1600 that is substantially similar to system 1300, with like elements having like numbers, but starting with a "16" rather than a "13". Hence, system 1600 comprises: a heatsink 1601; at least one light emitting material 1603 located on heatsink 1601; and, optics 1607 configured to rotate relative to at least one light emitting material 1603 around a rotational axis 1609 that is coaxial with axis 1605 of at least one light emitting material 1603. System 1600 further comprises a frame 1611, bearings 1613, a motor 1615, one or more lasers 1617, one or more lenses 1650 and an integrator 1651.

Further, optics 1607 is generally configured to: convey excitation light 1683 from laser 1617 to at least two different portions of light emitting material 1603; collect light 1693-1, 1693-2 emitted from the at least two different portions of light emitting material 1603 excited by excitation light 1683; and convey light 1693-1, 1693-2 collected from the at least two different portions of light emitting material 1603 to rotational axis 1609 for emission there along.

Optics 1607 comprises lenses 1643-1, 1643-2, and mirrors 1667-1, 1667-2, each respectively similar to lenses 1343-1, 1343-2, and mirrors 1367-1, 1367-2. However, as compared to optics 1307, optics 1607 comprises beamsplitter 1640, mirrors 1641-1, 1641-2, and beamcombiner 1665 in place of dichroic structure 1365. For example, beamsplitter 1640 comprises a mirror configured to split and/or reflect excitation light 1683 from laser 1617 towards both of mirrors 1641-1, 1641-2; beamsplitter 1640 can hence comprise a corner mirror formed by two mirrors at about 90° to each other, centred on rotation axis 1609 between laser 1617 and a plane formed by entrances to lenses 1643-1, 1643-2.

In any event, beamsplitter 1640 is configured to convey excitation light 1683 from laser 1617 to mirrors 1693-1, 1693-2, each of which in turn convey excitation light 1683 to light emitting material 1603. Light emitting material 1603 emits light 1693-1, 1693-2 which respectively is transmitted through mirrors 1641-1, 1641-2 to lenses 1643-1, 1643-2, which conveys light 1693-1, 1693-2 to beamcombiner 1665. Hence, each of mirrors 1641-1, 1641-2 comprise a dichroic mirror configured to reflect excitation light 1683 and transmit light 1693 emitted by light emitting material 1603.

Beamcombiner 1665 is substantially similar to beamsplitter 1640, however beamcombiner 1665 is configured to receive light 1693-1, 1693-2 from each of mirrors 1667-1, 1667-2 and combine light 1693-1, 1693-2 into light 1693, as well as convey light 1693 to lens 1650 and integrator 1651.

Hence, as depicted, optics 1607 convey excitation light 1683 to two spots on light emitting material 1603 (i.e. two rotation paths as optics 1607 rotate) thus spreading heat production over a larger area of light emitting material 1603. The two spots and/or rotation paths can be at similar or different radii.

In some implementations, frame 1611 can comprise beamsplitter 1640, mirrors 1641-1, 1641-2, and beamcombiner 1665; regardless, beamsplitter 1640 and mirrors 1641-1, 1641-2 are configured to rotate along with remaining optics 1607.

Furthermore, in some implementations, beamsplitter 1640 and beamcombiner 1665 can each comprise more than two respective mirrors; for example each of beamsplitter 1640 and beamcombiner 1665 can comprise three mirrors (for example a corner of a mirrored cube and the like), and optics 1607 comprises three sets of optics similar to the combination of lenses 1643-1, and mirrors 1641-1, 1667-1. Hence, in these implementations, heat production is spread over three spots and/or rotation paths at light emitting material 1603, which can be at similar and/or different radii. Further, when each path is at different radii, each path on light emitting material 1603 can comprise similar and/or different light emitting materials.

Heretofore, implementations where a light emitting material is located on one side of a heatsink have been described; however techniques, apparatus and systems described herein can be adapted to heatsinks where light emitting material is located on both sides. For example, attention is next directed to FIG. 17 which depicts a system 1700 that is substantially similar to system 1600, with like elements having like numbers, but starting with a "17" rather than a "16". Hence, system 1700 comprises: a heatsink 1701; at least two light emitting materials 1703-1, 1703-2 (collectively referred to hereafter as light emitting material 1703, and generically as a light emitting material 1703) located on opposing sides of heatsink 1701, each configured to emit light of different wavelengths when excited; and, optics 1707 configured to rotate relative to at least one light emitting material 1703 around a rotational axis 1709 that is coaxial with axis 1705 of at least one light emitting material 1703. System 1700 further comprises a frame 1711, bearings 1713, a motor 1715, one or more lasers 1717, one or more lenses 1750 and an integrator 1751. Frame 1711 is depicted in two portions, one on either side of heatsink 1701, which are assumed to be rotationally connected, so that when one portion of frame 1711 is rotated by motor 1715 on bearings 1317, the other portion of frame 1711 also rotates; such rotational connection can occur via a mechanical connection and the like, for example through an aperture of heatsink 1701 and/or around. Alternatively, system 1700 can comprise a motor for rotating each portion of frame 1711.

Further, optics 1707 is generally configured to: convey excitation light 1783 from laser 1717 to at least four different portions of light emitting material 1703, two portions on each side of heatsink 1701; collect light 1793-1, 1793-2, 1793-3, 1794-4 emitted from the at least four different portions of light emitting material 1703 excited by excitation light 1783; and convey light 1793-1, 1793-2, 1793-3, 1793-4 collected from the at least four different portions of light emitting material 1703 to rotational axis 1709 for emission there along.

Optics 1707 comprises beamsplitters 1740-1, 1740-2 (collectively referred to hereafter as beamsplitters 1740, and generically as a beamsplitter 1740), mirrors 1741-1, 1741-2, 1741-3, 1741-4 (collectively referred to hereafter as mirrors 1741, and generically as a mirror 1741), lenses 1743-1, 1743-2, 1743-3, 1743-4, (collectively referred to hereafter as lenses 1743, and generically as lenses 1743), beamcombiners 1765-1, 1765-2 (collectively referred to hereafter as beamcombiners 1765, and generically as a beamcombiner 1765), and mirrors 1767-1, 1767-2, 1767-3, 1767-4 (collectively referred to hereafter as mirrors 1767, and generically as a mirror 1767).

Mirrors 1741-1, 1741-2 each comprise dichroic mirrors configured to reflect excitation light 1783 from laser 1717, and transmit light 1793-1, 1793-2 emitted from light emitting material 1703-1, while mirrors 1741-3, 1741-4 each comprise mirrors configured to reflect excitation light 1783. Similarly, mirrors 1767-1, 1767-2 each comprise mirrors configured to reflect light 1793-1, 1793-2 emitted from light emitting material 1703-1, while mirrors 1767-3, 1767-4 each comprise dichroic mirrors configured to transmit excitation light 1783 and reflect light 1793-3, 1793-4 emitted from light emitting material 1703-1.

Otherwise beamsplitters 1740, mirrors 1741, lenses 1743, beamcombiners 1765, and mirrors 1767 are each respectively similar to beamsplitter 1640, mirrors 1641-1, 1641-2, lenses 1643-1, 1643-2, beamcombiner 1665, and mirrors 1667-1, 1667-2. However, beamsplitter 1740-1, mirrors 1741-1, 1741-2, lenses 1743-1, 1743-2, beamcombiner 1765-1, and mirrors 1767-1, 1767-2 are located on a same side of heatsink 1701 as lens 1750 and integrator 1751; and beamsplitter 1740-2, mirrors 1741-3, 1741-4, lenses 1743-3, 1743-4, beamcombiner 1765-2, and mirrors 1767-3, 1767-4 are located on an opposite side of heatsink 1701 as lens 1750 and integrator 1751 and/or on a same side of heatsink 1701 as laser 1717.

Furthermore, beamsplitter 1740-2 is configured to both reflect (e.g. split) excitation light 1783 received at beamsplitter from laser 1717 towards mirrors 1741-3, 1741-4, and transmit a portion of excitation light 1783 towards beamcombiner 1765-2; and, beamcombiner 1765-2 is configured to combine light 1793-3, 1793-4 and transmit excitation light 1783 received through beamsplitter 1740-2. Mirrors 1741-3, 1741-4 are each positioned and/or configured to reflect excitation light 1783 through respective mirrors 1767-3, 1767-4 and respective lenses 1743-3, 1743-4, while lenses 1743-3, 1743-4 are respectively positioned and/or configured to collect light 1793-3, 1793-4 and convey emitted from light emitting material 1703-2 (when excited by excitation light 1783) to mirrors 1767-3, 1767-4, which are respectively positioned and/or configured to reflect light 1793-3, 1793-4 towards beamcombiner1765-2. Beamcombiner 1765-2 combines light 1763-3, 1793-4 and reflects light 1763-3, 1793-4 through the aperture of heatsink 1701 towards beamsplitter 1740-1 along rotational axis 1709.

Beamsplitter 1740-1 is configured to reflect (e.g. split) excitation light 1783 received at beamsplitter from laser 1717 towards mirrors 1741-3, 1741-4, and transmit light 1763-3, 1793-4 towards beamcombiner 1765-1; and beamcombiner 1765-1 is configured to combine light 1793-1, 1793-2, received from mirrors 1767-1, 1767-2 with light 1793-3, 1793-4 (i.e. beamcombiner 1765-2 is transparent to light 1763-3, 1793-4). Mirrors 1743-1, 1743-2 are each respectively positioned and/or configured to receive excitation light 1783 from beamsplitter 1740-1, and respectively reflect excitation light 1783 through lenses 1743-1, 1743-2 to light emitting material 1703-1 so that light 1793-1, 1793-2 is emitted. Lenses 1743-1, 1743-2 are each respectively positioned and/or configured to collect light 1793-1, 1793-2 emitted from light emitting material 1703-1, and respectively convey light 1793-1, 1793-2 to mirrors 1767-1, 1767-2 which are positioned and/or configured to convey light 1793-1, 1793-2 to beamcombiner 1765-1, where light 1793-1, 1793-2 is combined with light 1793-3, 1793-4 into light 1793 and conveyed to lens 1750 and integrator 1751.

While system 1700 is depicted as exciting light emitting material 1703 at four different portions, each at about the same radius, in other implementations, one or more of the portions of light emitting material can be at a different radius.

Figure 17:
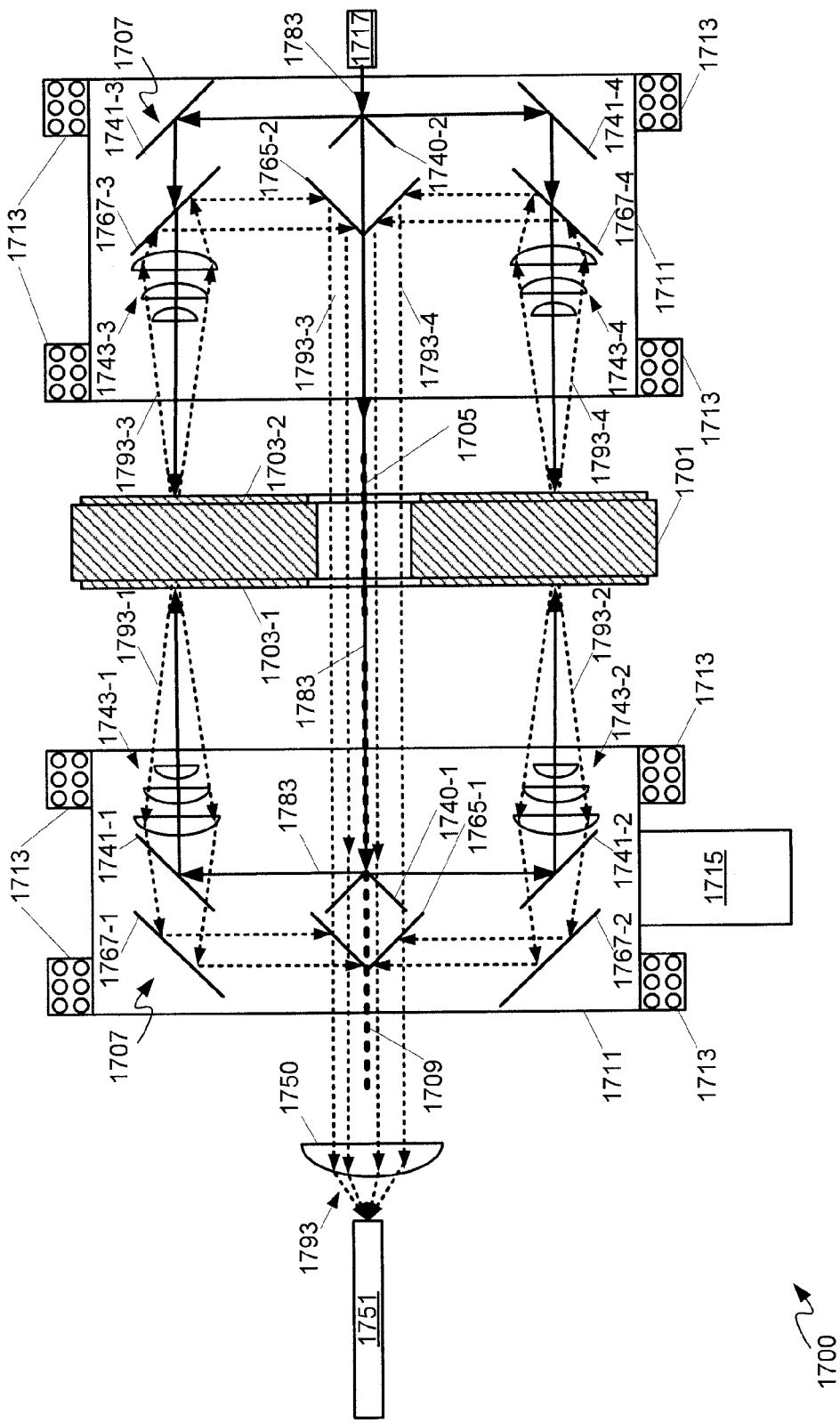
FIG. 17 depicts a side view, and a partial cross-sectional view, of an alternative system that includes a rotationally static light emitting material with rotating optics for collecting light emitted on opposite sides of a heatsink, according to non-limiting implementations.

Furthermore, while a specific combination of optical elements is depicted in FIG. 17 for exciting and collecting light, other combinations of optical elements are within the scope of present implementations, for example based on any of systems 100, 600, 800, 900, 1000, 1100, and 1300 and/or portions thereof.

In any event, any of the systems described herein can be adapted to excite light emitting material located on two sides of a heatsink using a combination of mirrors, dichroic mirrors, prisms, and other optical elements. For example, systems 1400 and 1500 can be combined to excite light emitting material located on both an exterior and an exterior of a cylindrical heatsink using one or more dichroic mirrors to convey light to optics disposed about an exterior and interior of the cylindrical heatsink, and further one or more dichroic lenses to combine light emitted from the exterior and interior light emitting materials.

While implementations described heretofore are all described with reference to systems where a light emitting material is located on a heatsink that can be reflective, rotating optics described herein can be adapted for use with systems where light emitting material and/or a heatsink are transmissive so that light emitted by the light emitting material can be collected on both sides of the heatsink by optics rotating there around.

Hence, described herein are various implementations of a system where an input path (and alternatively an output path) of excitation light and an output path of light are fixed along a rotational axis of optics that rotate about a rotationally fixed light emitting material and heatsink, to distribute light production at the light emitting material over the surface of the heatsink, so that a static heat sink can be used to cool the light emitting material.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A system comprising:
   a heatsink;
   at least one light emitting material located on the heatsink, at least a portion of the at least one light emitting material being circularly symmetrical around an axis, the heatsink and the at least one light emitting material being rotationally fixed;
   optics configured to rotate relative to the at least one light emitting material around a rotational axis that is coaxial with the axis of the at least one light emitting material, the optics configured to:
      receive excitation light along the rotational axis;
      convey the excitation light to one or more locations on the light emitting material as the optics are rotating;
      collect light emitted from the one or more locations on the light emitting material excited by the excitation light; and,
      convey the light collected from the at least one light emitting material to the rotational axis for emission there along.

2. The system of claim 1, further comprising a motor configured to rotate the optics relative to the at least one light emitting material.

3. The system of claim 1, further comprising at least one stationary light source configured to generate the excitation light.

4. The system of claim 1, further comprising: at least one stationary light source configured to generate the excitation light; and stationary optics for conveying the excitation light to the optics along the rotational axis.

5. The system of claim 1, further comprising one or more of a body and a frame, one or more of the body and the frame comprising the optics.

6. The system of claim 1, further comprising one or more of a body and a frame, one or more of the body and the frame comprising the optics and a counter balance so that a center of mass of one or more of the body and the frame is located along the rotational axis.

7. The system of claim 1, wherein the optics comprise one or more of: at least one dichroic mirror; at least one lens; and at least one prism.

8. The system of claim 1, wherein a surface of the heatsink and the at least one light emitting material comprises an annulus symmetrical about the axis, and the optics are further configured to rotate along the surface.

9. The system of claim 1, wherein the heatsink comprises a cylinder, and the at least one light emitting material is located on an interior surface of the cylinder, the optics configured to rotate within the cylinder.

10. The system of claim 1, wherein the heatsink comprises a cylinder, and the at least one light emitting material is located on an exterior surface of the cylinder, the optics further configured to rotate around the exterior surface of the cylinder.

11. The system of claim 1, wherein the at least one light emitting material comprises at least two light emitting materials located at different portions of the heatsink, each of the at least two light emitting materials being circularly symmetric about the axis, the optics further configured to convey the excitation light to each of the at least two light emitting materials as the optics are rotating.

12. The system of claim 1, wherein the optics are further configured to: convey the excitation light to at least two different portions of the at least one light emitting material; collect the light emitted from the at least two different portions excited by the excitation light; and convey the light collected from the at least two different portions to the rotational axis for emission there along.

13. The system of claim 1, further comprising apparatus for displacing the heatsink relative to the optics.

14. The system of claim 1, wherein the heatsink further comprises a static waterblock.

15. The system of claim 1, wherein the heatsink comprises a toroid symmetrical about the axis.

16. The system of claim 1, wherein the heatsink comprises a toroid symmetrical about the axis and the optics are configured to one or more of: receive the excitation light through the toroid; and convey the light collected from the at least one light emitting material through the toroid.

17. The system of claim 1, wherein the optics are further configured to receive the excitation light from a first side of the optics and convey the light collected from the at least one light emitting material back through the first side.

18. The system of claim 1, wherein the optics are further configured to receive the excitation light from a first side of the optics and convey the light collected from the at least one light emitting material through a second side opposite the first side.

19. The system of claim 1, wherein the light emitting material is located on opposing sides of the heatsink and the optics are further configured to receive the excitation light from both of the opposing sides of the heatsink.

* * * * *